United States Patent
Kuramochi et al.

(10) Patent No.: US 7,982,520 B2
(45) Date of Patent: Jul. 19, 2011

(54) SIGNAL GENERATING APPARATUS AND TEST APPARATUS

(75) Inventors: Yasuhide Kuramochi, Gunma (JP); Masayuki Kawabata, Saitama (JP); Kouichiro Uekusa, Miyagi (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/642,706

(22) Filed: Dec. 18, 2009

(65) Prior Publication Data
US 2011/0148499 A1 Jun. 23, 2011

(51) Int. Cl.
*H03L 5/00* (2006.01)
(52) U.S. Cl. .................... 327/306; 341/150
(58) Field of Classification Search .......... 341/144, 341/150; 327/306
See application file for complete search history.

(56) References Cited

U.S. PATENT DOCUMENTS

| | | | |
|---|---|---|---|
| 6,049,321 A * | 4/2000 | Sasaki | 345/99 |
| 6,271,784 B1 * | 8/2001 | Lynn et al. | 341/150 |
| 6,556,162 B2 * | 4/2003 | Brownlow et al. | 341/145 |
| 6,741,197 B1 * | 5/2004 | Melanson | 341/150 |
| 6,759,975 B1 * | 7/2004 | Lee et al. | 341/144 |
| 6,781,532 B2 * | 8/2004 | Wei | 341/122 |
| 2010/0109674 A1 * | 5/2010 | Kuramochi et al. | 324/537 |

FOREIGN PATENT DOCUMENTS

| | | |
|---|---|---|
| JP | 1987-082821 A | 4/1987 |
| JP | 1987-125714 A | 6/1987 |
| JP | 1989-041011 A | 2/1989 |
| JP | 1993-252032 A | 9/1993 |
| JP | 9-275345 A | 10/1997 |

* cited by examiner

*Primary Examiner* — Lincoln Donovan
*Assistant Examiner* — William Hernandez
(74) *Attorney, Agent, or Firm* — Chen Yoshimura LLP

(57) ABSTRACT

Provided is a signal generating apparatus that outputs from an output end thereof an output voltage corresponding to input data supplied thereto, comprising: a DA converter that outputs a voltage corresponding to data supplied thereto; a capacitor section that is provided between the output end and a standard potential; a transmission switch that provides a connection or a disconnect between a voltage generating end of the DA converter and the output end; and a control section that causes the DA converter to charge the capacitor section with a voltage corresponding to the input data by repeatedly connecting and disconnecting the transmission switch, thereby causing the voltage of the capacitor section to gradually approach the output voltage corresponding to the input data.

18 Claims, 22 Drawing Sheets

| INPUT DATA | REFERENCE VOLTAGE (V<sub>REF</sub>) | k | d |
|---|---|---|---|
| $2^{(N-1)}-1$ <br> ⋮ <br> 1 <br> 0 | V<sub>REFN</sub> | $2^{(N-1)}-1$ <br> ⋮ <br> 1 <br> 0 | 0 <br> ⋮ <br> 0 <br> 0 |
| −1 <br> −2 <br> ⋮ <br> $-2^{(N-1)}$ | V<sub>REFP</sub> | 0 <br> 1 <br> ⋮ <br> $2^{(N-1)}-1$ | 1 <br> 1 <br> ⋮ <br> 1 |

FIG. 6

| INPUT DATA | | REFERENCE VOLTAGE (V_REF) | k | d | OUTPUT VOLTAGE (V_DAC) |
|---|---|---|---|---|---|
| INTEGER | BINARY | | | | |
| 127 | 0111 1111 | $V_{CM}-128mV$ | 127 | 0 | $V_{CM}+127mV$ |
| ... | ... | ... | ... | ... | ... |
| 1 | 0000 0001 | $V_{CM}-128mV$ | 1 | 0 | $V_{CM}+1mV$ |
| 0 | 0000 0000 | $V_{CM}-128mV$ | 0 | 0 | $V_{CM}$ |
| -1 | 1111 1111 | $V_{CM}+128mV$ | 0 | 1 | $V_{CM}-1mV$ |
| -2 | 1111 1110 | $V_{CM}+128mV$ | 1 | 1 | $V_{CM}-2mV$ |
| ... | ... | ... | ... | ... | ... |
| -128 | 1000 0000 | $V_{CM}+128mV$ | 127 | 1 | $V_{CM}-128mV$ |

FIG. 9

SIGNAL GENERATING APPARATUS AND TEST APPARATUS

BACKGROUND

1. Technical Field

The present invention relates to a signal generating apparatus and a test apparatus.

2. Related Art

A conventional charge redistribution DA converter is known. The charge redistribution DA converter is provided with an internal capacitor array in which the capacitors are connected in a ladder formation.

The charge redistribution DA converter charges the capacitor array with an amount of charge corresponding to a reference voltage during a first half of the period of the data rate, and this is known as the "refresh mode." During the second half of the each period of the data rate, the charge redistribution DA converter switches the connection of the capacitor array according to the input data, and this is known as the "output mode." As a result, the charge redistribution DA converter can generate a voltage corresponding to the input data. This charge redistribution DA converter consumes less power than other types of DA converters.

Such a charge redistribution DA converter, however, generates noise such as refresh noise, charge injection, and clock feedthrough caused by switch driving when switching between the refresh mode and the output mode. Accordingly, the charge redistribution DA converter has a less accurate output voltage due to the noise generated when switching between modes.

When an IC or the like is imbedded in a charge redistribution DA converter, it is desirable that both the overall capacitance and area of the capacitor array be small. However, when the overall capacitance of the capacitor array is small, thermal noise, known as KT/C noise, increases. Accordingly, in the charge redistribution DA converter there is a limit on how small the capacitor array can be and how low the overall capacitance of the capacitor array can be.

Furthermore, the charge redistribution DA converter can be provided with a low-capacitance capacitor realized by a gate capacitance of a transistor. However, since there is a non-linear voltage dependency on the gate capacitance of the transistor, it is difficult for the charge redistribution DA converter to achieve high accuracy.

Patent Document 1: Japanese Patent Application Publication No. 1993-252032
Patent Document 2: Japanese Patent No. 3166603
Patent Document 3: Japanese Patent Application Publication No. 1987-082821
Patent Document 4: Japanese Patent Application Publication No. 1989-041011
Patent Document 5: U.S. Pat. No. 6,271,784
Patent Document 6: U.S. Pat. No. 6,781,532
Patent Document 7: Japanese Patent Application Publication No. 1987-125714

SUMMARY

Therefore, it is an object of an aspect of the innovations herein to provide a signal generating apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary signal generating apparatus may include a signal generating apparatus that outputs from an output end thereof an output voltage corresponding to input data supplied thereto, comprising: a DA converter that outputs a voltage corresponding to data supplied thereto; a capacitor section that is provided between the output end and a standard potential; a transmission switch that provides a connection or a disconnect between a voltage generating end of the DA converter and the output end; and a control section that causes the DA converter to charge the capacitor section with a voltage corresponding to the input data by repeatedly connecting and disconnecting the transmission switch, thereby causing the voltage of the capacitor section to gradually approach the output voltage corresponding to the input data. An exemplary test apparatus may include a test apparatus provided with the signal generating apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 6 shows values for the reference voltage, a parameter k, and a parameter d selected according to pieces of input data $-2^{(N-1)}$ to $2^{(N-1)}-1$ provided thereto.

FIG. 9 shows exemplary values for the reference voltage, the parameter k, and the parameter d along with the resulting output voltages when input data from −128 to 127 is provided

DESCRIPTION OF EXEMPLARY EMBODIMENTS

Figure 1:
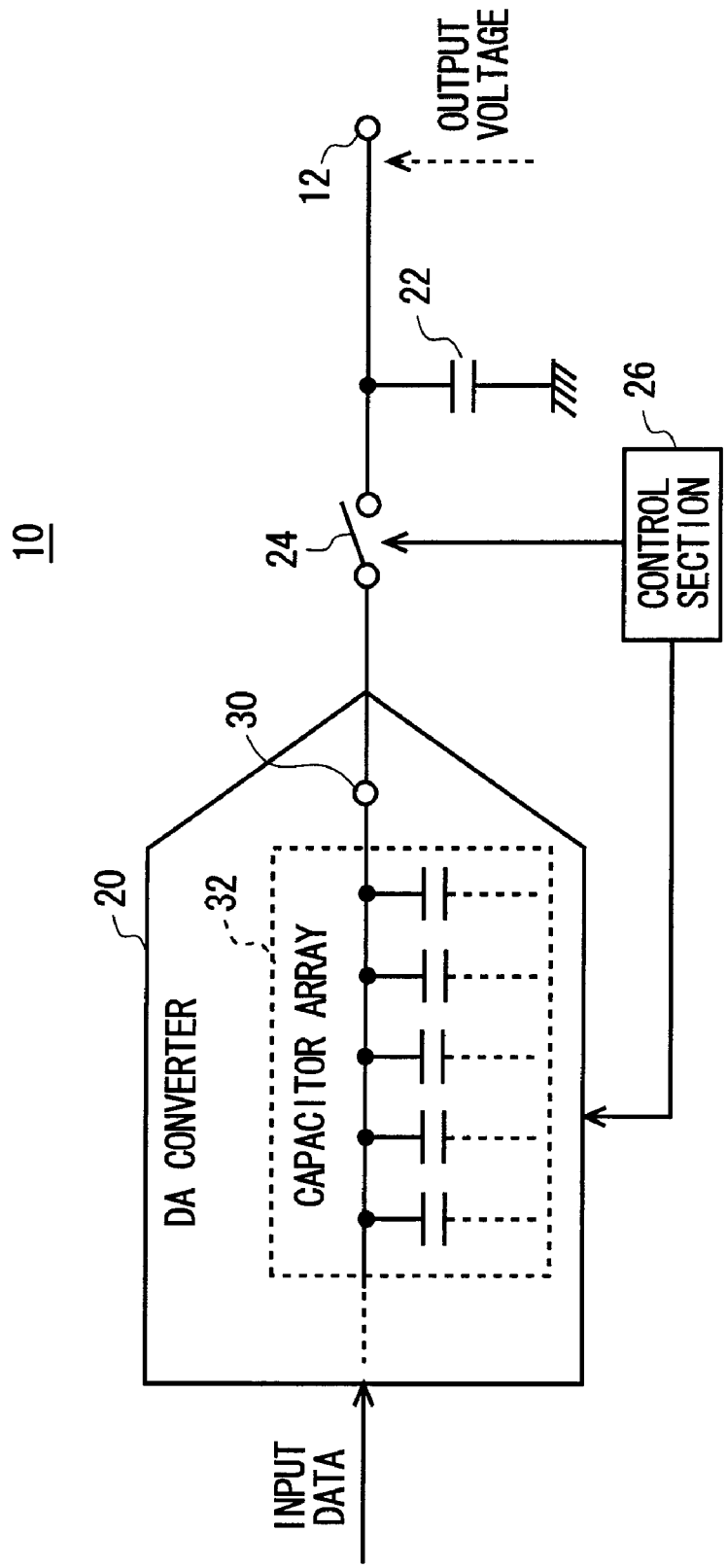
FIG. 1 shows a configuration of a signal generating apparatus 10 according to an embodiment of the present invention.

Hereinafter, some embodiments of the present invention will be described. The embodiments do not limit the invention according to the claims, and all the combinations of the features described in the embodiments are not necessarily essential to means provided by aspects of the invention.

A signal generating apparatus 10 according to an embodiment of the present invention outputs from an output end 12 thereof an output voltage corresponding to input data supplied thereto. The signal generating apparatus 10 includes a DA converter 20, a capacitor section 22, a transmission switch 24, and a control section 26.

The DA converter 20 outputs a voltage corresponding to data supplied thereto. In the present embodiment, the DA converter 20 is a charge redistribution DA converter having a capacitor array 32. In the present embodiment, the capacitor array 32 in the DA converter 20 is directly connected to the voltage generating end 30 of the DA converter 20 without a buffer or the like provided therebetween.

The DA converter 20 switches from a refresh mode during which a charge according to a reference voltage is accumulated in the capacitor array 32 and an output mode during which a voltage corresponding to input data is generated from the voltage generating end 30, by switching a connection arrangement of the capacitor array 32 in which the charge is stored according to the input data. When input data is supplied to the signal generating apparatus 10, the DA converter 20 alternates between the refresh mode and the output mode during which the voltage generating end 30 generates the voltage corresponding to the input data.

The capacitor section 22 is provided between the output end 12 and the standard potential. The capacitance of the capacitor section 22 may be greater than the total capacitance of the capacitor array 32 in the DA converter 20.

The transmission switch 24 is provided between the output end 12 and the voltage generating end 30 of the DA converter 20. The transmission switch 24 is controlled by the control section 26 to provide a connection or a disconnect between the output end 12 and the voltage generating end 30 of the DA converter 20.

The control section 26 causes the DA converter 20 to alternate between the refresh mode and the output mode according to the input data supplied to the signal generating apparatus 10. Therefore, the control section 26 can cause the DA converter 20 to repeatedly output from the voltage generating end 30 thereof a voltage corresponding to the input data.

The control section 26 also alternately switches the transmission switch 24 between the connected and disconnected states. More specifically, the control section 26 connects the transmission switch 24 during at least a portion of the period of the output mode, and disconnects the transmission switch 24 at other times. For example, the control section 26 may connect the transmission switch 24 during the output mode and disconnect the transmission switch 24 during the refresh mode. In such a case, the control section 26 may switch the transmission switch in synchronization with the refresh mode and the output mode of the DA converter 20.

Here, the capacitor array 32 in the DA converter 20 is connected directly to the voltage generating end 30 of the DA converter 20 without a buffer or the like therebetween. Accordingly, when the DA converter 20 connects the transmission switch 24 during the output mode, current moves between the capacitor section 22 and the capacitor array 32 in the DA converter 20, such that the voltage generated from the voltage generating end 30 and the voltage of the capacitor section 22, i.e. the output voltage, become equal.

For example, if the voltage generated from the voltage generating end 30 is higher than the voltage of the capacitor section 22 when the DA converter 20 is in the output mode and the transmission switch 24 is disconnected, the transmission switch 24 is connected to lower the voltage of the voltage generating end 30, which increases the voltage of the capacitor section 22. On the other hand, if the voltage generated from the voltage generating end 30 is lower than the voltage of the capacitor section 22 when the DA converter 20 is in the output mode and the transmission switch 24 is disconnected, the transmission switch 24 is connected to increase the voltage of the voltage generating end 30, which lowers the voltage of the capacitor section 22.

Accordingly, the control section 26 causes the DA converter 20 to alternate between the refresh mode and the output mode to repeatedly generate a voltage corresponding to the input data, and also connects the transmission switch 24 during the output mode to gradually increase or decrease the voltage of the capacitor section 22, thereby outputting a voltage corresponding to the input data. In this way, the control section 26 causes the DA converter 20 to charge the capacitor section 22 with a voltage corresponding to the input data by alternately connecting and disconnecting the transmission switch 24, and thereby causes the voltage of the capacitor section 22 to gradually approach the output voltage corresponding to the input data.

Figure 2:
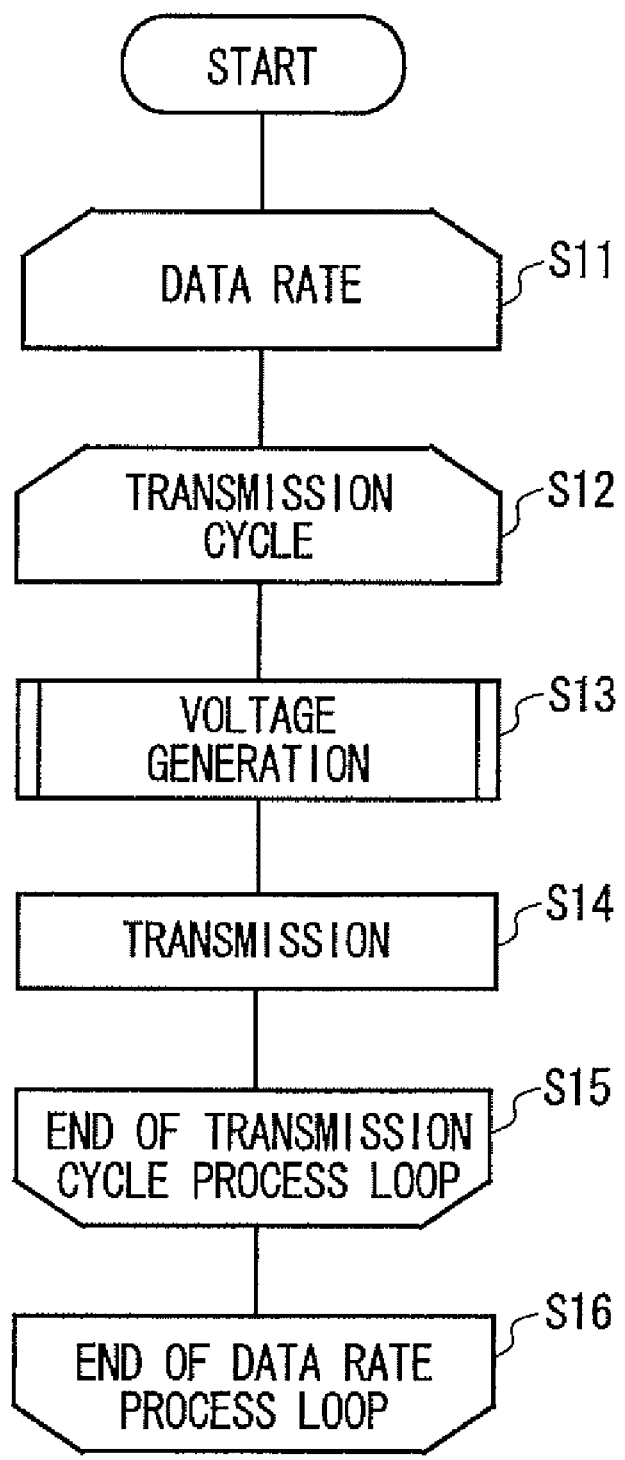
FIG. 2 a process flow of the signal generating apparatus 10 according to an embodiment of the present invention.

FIG. 2 shows a process flow of the signal generating apparatus 10 according to the present embodiment. The signal generating apparatus 10 repeats the processes of step S12 to step S15 for each data rate, i.e. each time input data is supplied (the process loop from S11 to S16).

For each data rate, the signal generating apparatus 10 performs the voltage generation process (S13) and the transmission process (S14) for each transmission cycle obtained as a division of the data rate. In the voltage generation process (S13), the signal generating apparatus 10 causes the DA converter 20 to generate a voltage corresponding to the input data supplied thereto. The voltage generation process by the DA converter 20 is described further in relation to FIG. 5.

In the transmission process (S14), the signal generating apparatus 10 connects the voltage generating end 30 of the DA converter 20 to the capacitor section 22, thereby transmitting the charge in the DA converter 20 to the capacitor section 22 or transmitting the charge in the capacitor section 22 to the DA converter 20. In this way, the signal generating apparatus 10 can cause the voltage of the voltage generating end 30 of the DA converter 20 to match the voltage of the capacitor section 22.

Figure 3:
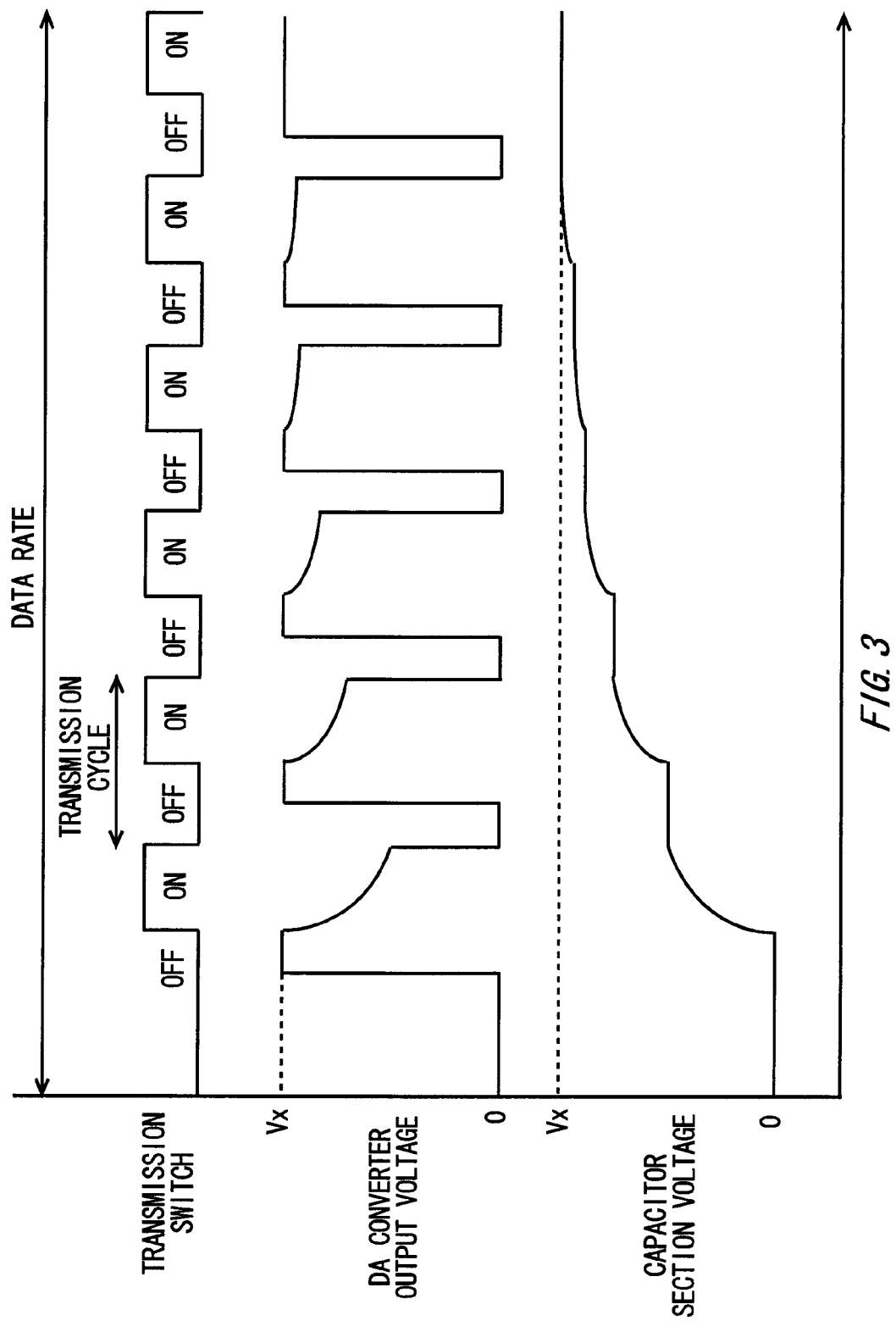
FIG. 3 shows an exemplary voltage waveform of each node and a switching timing of the transmission switch 24 in the signal generating apparatus 10 according to the present embodiment.

FIG. 3 shows an exemplary voltage waveform of each node and a switching timing of the transmission switch 24 in the signal generating apparatus 10 according to the present embodiment. First, the control section 26 turns the transmission switch 24 OFF. During the period in which the transmission switch 24 is OFF, the DA converter 20 performs the operation of the refresh mode and then performs the operation of the output mode to generate the voltage corresponding to the input data. The DA converter 20 generates a common voltage during the refresh mode.

Accordingly, while the transmission switch 24 is OFF, the voltage generating end 30 of the DA converter 20 first becomes the common voltage, and then becomes a voltage Vx corresponding to the input data. In FIG. 3, the common voltage is 0 V.

Next, the control section 26 turns the transmission switch 24 ON. During the period in which the transmission switch 24 is ON, the DA converter 20 continues the operation of the output mode. Accordingly, one of the voltage of the voltage generating end 30 of the DA converter 20 and the voltage of the capacitor section 22 increases while the other decreases, such that the two voltages approach each other.

The control section 26 repeatedly turns the transmission switch 24 ON and OFF in this manner. For each repetition of the transmission switch 24 being turned ON and OFF, the potential difference between the capacitor section 22 and the voltage generating end 30 of the DA converter 20 when the transmission switch 24 is OFF becomes gradually smaller. Accordingly, the control section 26 can cause the voltage of the capacitor section 22 to match the voltage Vx corresponding to the input data.

The signal generating apparatus 10 of the present embodiment described above causes a voltage corresponding to the input data to be generated from the capacitor section 22, and so the noise generated when the DA converter 20 switches between the refresh mode and the output mode is filtered by the capacitor section 22. Furthermore, the signal generating apparatus 10 can restore the decrease in voltage caused by a droop. Accordingly, the signal generating apparatus 10 of the present embodiment can output an accurate voltage with little noise.

Furthermore, the signal generating apparatus 10 of the present embodiment can decrease the effect of the KT/C noise included in the output voltage by increasing the capacitance of the capacitor section 22. Accordingly, with the signal generating apparatus 10 of the present embodiment, the capacitor array 32 can be made smaller and have a lower overall capacitance.

Yet further, even when the signal generating apparatus 10 of the present embodiment has a non-linear voltage dependency on the capacitance value of the capacitor section 22, the voltage of the capacitor section 22 can be matched to the voltage corresponding to the input data. Accordingly, the signal generating apparatus 10 of the present embodiment can output an accurate voltage while also achieving a smaller size and larger capacitance for the capacitor section 22.

Figure 4:
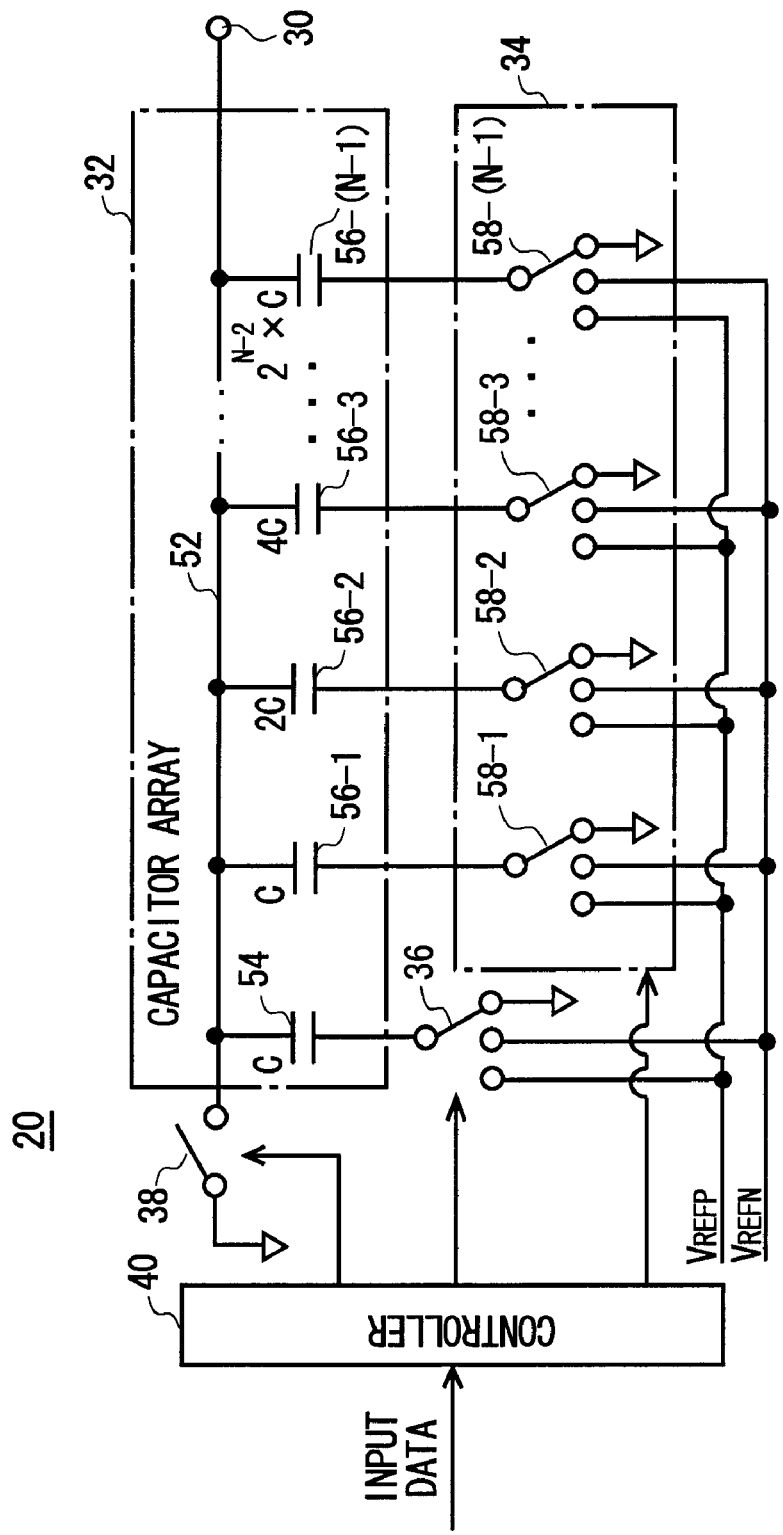
FIG. 4 shows a configuration of the DA converter 20 according to an embodiment of the present invention.

FIG. 4 shows an exemplary configuration of the DA converter 20 according to the present embodiment. The DA converter 20 shown in FIG. 4 generates a voltage according to N-bit input data, where N is an integer greater than 2.

The DA converter 20 includes the capacitor array 32, a switching section 34, a dummy switch 36, a refresh switch 38, and a controller 40, which is the conversion control section. The capacitor array 32 is connected to the voltage generating end 30. The capacitor array 32 includes an output line 52, a dummy capacitor 54, and bit capacitors 56-1 to 56-(N−1).

The output line 52 is connected to the voltage generating end 30 without a buffer or the like therebetween. The dummy capacitor 54 has one end thereof connected to the output line 52. The dummy capacitor 54 has a capacitance corresponding to the weighting of a first bit, i.e. least significant bit, of the input data.

Each of the bit capacitors 56-1 to 56-(N−1) has one end thereof connected to the output line 52. Each of the bit capacitors 56-1 to 56-(N−1) corresponds to one of the first to (N−1)th bits of the input data, and has a capacitance according to the weighting of the corresponding bit. In the following example, it is assumed that two types of reference potential are used, e.g. a positive reference potential $V_{REFP}$ and a negative reference potential $V_{REFN}$, the first bit has a capacitance C, the second bit has a capacitance 2×C, the third bit has a capacitance $2^2$×C, and the (N−1)th bit has a capacitance $2^{(N-2)}$×C.

The switching section 34 switches the connections of the capacitor array 32. The switching section 34 includes bit switches 58-1 to 58-(N−1). The bit switches 58-1 to 58-(N−1) correspond respectively to the bit capacitors 56-1 to 56-(N−1). Each of the bit switches 58-1 to 58-(N−1) connects the other end of the corresponding bit capacitor 56, which is the end of the bit capacitor 56 not connected to the output line 52, to one of the positive reference potential $V_{REFP}$, the negative reference potential $V_{REFN}$, and the common potential $V_{CM}$.

The dummy switch 36 connects the other end of the dummy capacitor 54, which is the end not connected to the output line 52, to one of the positive reference potential $V_{REFP}$, the negative reference potential $V_{REFN}$, and the common potential $V_{CM}$. The refresh switch 38 switches whether the end of the output line 52 on the side opposite the voltage generating end 30 is connected to the common potential $V_{CM}$. The controller 40 controls the switching of the switching section 34, the dummy switch 36, and the refresh switch 38 according to the input data supplied thereto.

Here, the positive reference potential $V_{REFP}$ and the negative reference potential $V_{REFN}$ are voltages with opposite polarities centered on the common potential $V_{CM}$, and both have the same difference relative to the common potential $V_{CM}$. The common potential $V_{CM}$ is represented by the inverted triangle marks in FIG. 4. The common potential $V_{CM}$ may be a ground potential, for example. The DA converter 20 described above can generate an analog voltage divided with an N-bit resolution between the positive reference potential $V_{REFP}$ and the negative reference potential $V_{REFN}$.

Figure 5:
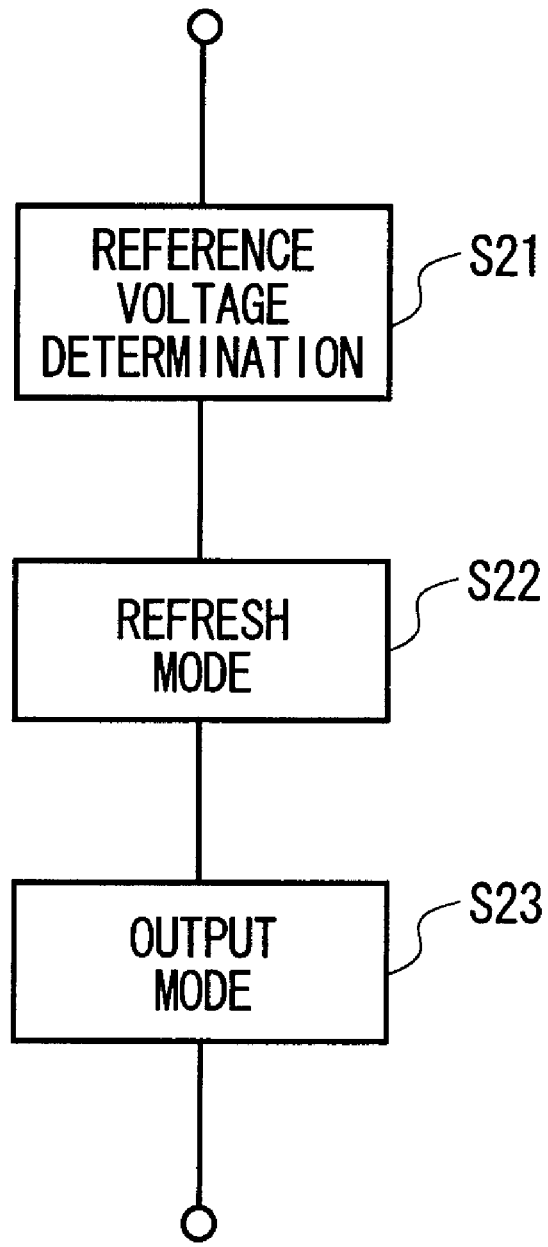
FIG. 5 shows a signal generation process flow of the DA converter 20 according to an embodiment of the present invention.
Figure 7:
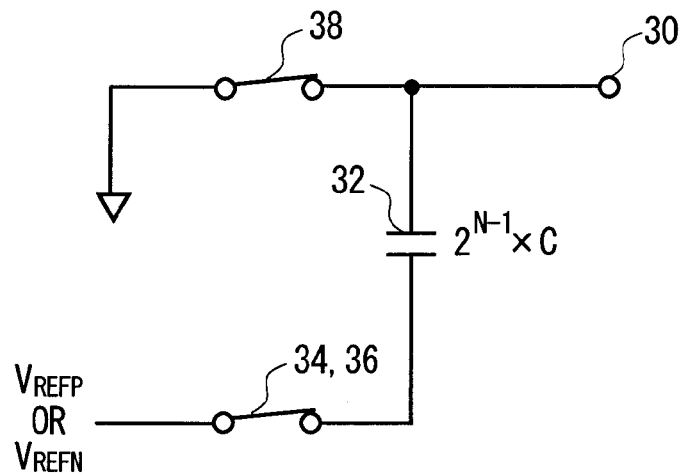
FIG. 7 shows an exemplary connection of the DA converter 20 according to the present embodiment during the refresh mode.
Figure 8:
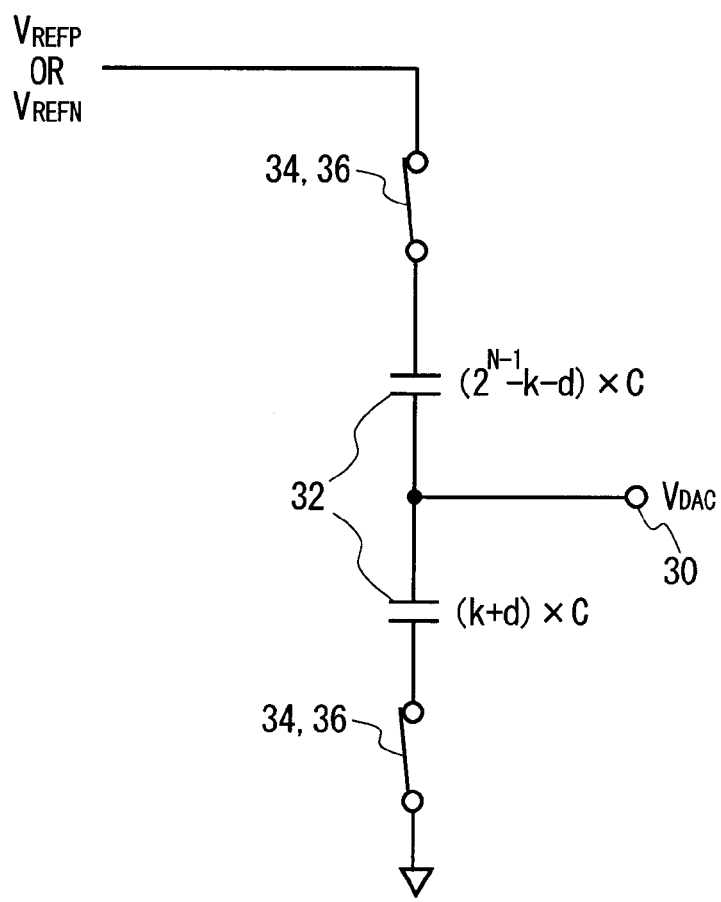
FIG. 8 shows an exemplary connection of the DA converter 20 according to the present embodiment during the output mode.

FIG. 5 shows a process flow of the voltage generation by the DA converter 20 according to the present embodiment. FIG. 6 shows values for the reference voltage, a parameter k, and a parameter d selected according to pieces of input data $-2^{(N-1)}$ to $2^{(N-1)}-1$ provided thereto. FIG. 7 shows an exemplary connection of the DA converter 20 according to the present embodiment during the refresh mode. FIG. 8 shows an exemplary connection of the DA converter 20 according to the present embodiment during the output mode.

First, at step S21, the controller 40 of the DA converter 20 selects one of the positive reference potential $V_{REFP}$ and the positive reference potential $V_{REFP}$ according to the input data supplied thereto. More specifically, the controller 40 selects the positive reference potential $V_{REFP}$ when the input data is less than the central value of the data range, and selects the negative reference potential $V_{REFN}$ when the input data is greater than or equal to the central value of the data range.

For example, the controller 40 selects the positive reference potential $V_{REFP}$ and the negative reference potential $V_{REFN}$ according to the value of the most significant bit, i.e. the Nth bit, of the input data. In the example of FIG. 6, the DA converter 20 is supplied with input data with a range from $-2^{(N-1)}$ to $2^{(N-1)}-1$. In this case, the controller 40 selects the positive reference potential $V_{REFP}$ when the input data is between $-2^{(N-1)}$ and $-1$, inclusive, and selects the negative reference potential $V_{REFN}$ when the input data is between 0 and $2^{(N-1)}-1$, inclusive.

Furthermore, the controller 40 calculates the parameter k used for switching the bit capacitors 56-1 to 56-(N-1) of the capacitor array 32 according to the input data, for example. The parameter k is a (N-1)-bit value, which is 1 bit less than the input data. The controller 40 selects k to be a value that is greater when the input data is further from the central value of the data range. For example, in the example of FIG. 6, the controller 40 selects k to be from $2^{(N-1)}-1$ to 0 when the input data is from $-2^{(N-1)}$ to $-1$. The controller 40 selects k to be from 0 to $2^{(N-1)}-1$ when the input data is from 0 to $2^{(N-1)}-1$.

The controller 40 may select the parameter d used for switching the dummy capacitor 54 according to the input data. The parameter d is a 1-bit value. The controller 40 selects the parameter d to be 1 when the input data is less than the central value of the data range, and selects the parameter d to be 0 when the input data is greater than or equal to the central value of the data range. In the example of FIG. 6, the controller 40 selects the parameter d to be 1 when the input data is from $-2^{(N-1)}$ to $-1$, and selects the parameter d to be 0 when the input data is from 0 to $2^{(N-1)}-1$.

Next, at step S22, the controller 40 enters the refresh mode. In the refresh mode, the controller 40 charges the capacitor array 32 to the selected reference potential.

More specifically, as shown in FIG. 7, the controller 40 connects the refresh switch 38. The controller 40 switches the switching section 34 and the dummy switch 36 to connect the other ends of all of the bit capacitors 56 and the dummy capacitor 54 of the capacitor array 32, which are the ends not connected to the output line 52, to the selected reference potential, which is the positive reference potential $V_{REFP}$ or the negative reference potential $V_{REFN}$.

Next, at step S23, the controller 40 of the DA converter 20 enters the output mode. In the output mode, the controller 40 switches the ratio between (i) the capacitance between the common potential $V_{CM}$ and the voltage generating end 30 in the capacitor array 32 and (ii) the capacitance between the reference potential and the voltage generating end 30, according to the input data, to generate from the voltage generating end 30 a voltage corresponding to the input data.

For example, the bit capacitors 56-1 to 56-(N-1) correspond one-to-one with the first through (N-1)th bits of the parameter k expressed as a binary value. The controller 40 connects each of the bit capacitors 56-1 to 56-(N-1) to the reference potential selected when the corresponding bit of the parameter k is 0, which is either the positive reference potential $V_{REFP}$ or the negative reference potential $V_{REFN}$, and connects each of the bit capacitors 56-1 to 56-(N-1) to the common potential $V_{CM}$ when the corresponding bit of the parameter k is 1. Furthermore, the controller 40 connects the dummy capacitor 54 to the selected reference potential when the parameter d is 0, and connects the dummy capacitor 54 to the common potential $V_{CM}$ when the parameter d is 1.

As a result, as shown in FIG. 8, the controller 40 switches the switching section 34 and the dummy switch 36 such that a capacitance of $(k+d) \times C$ is connected between the voltage generating end 30 and the common potential $V_{CM}$ and a capacitance of $(2^{N-1}-k-d) \times C$ is connected between the voltage generating end 30 and the selected reference potential, which is the positive reference potential $V_{REFP}$ or the negative reference potential $V_{REFN}$. Therefore, the DA converter 20 can output an output voltage $V_{DAC}$ as shown below in Expression 1.

$$V_{DAC} = \{(2^{N+1}+k+d) \times V_{CM} - (k+d) \times V_{REF}\}/2^{N-1}$$ Expression 1:

In Expression 1, $V_{REF}$ represents the selected $V_{REFP}$ or $V_{REFN}$.

FIG. 9 shows exemplary values for the reference voltage, the parameter k, and the parameter d along with the resulting output voltages when input data from $-128$ to 127 is provided and 1 LSB=1 mV. By generating the voltage with the settings shown in FIG. 9, the DA converter 20 can output a voltage that changes in steps of 1 mV within a range from $V_{CM}-128$ mV to $V_{CM}+127$ mV, according to the input data with a range from $-128$ to 127 supplied thereto.

As a result of the above process, the DA converter 20 can generate an analog voltage corresponding to N-bit input data supplied thereto. The configuration of the DA converter 20 of the present embodiment is not limited to the configuration described in FIGS. 4 to 9, and a charge redistribution DA converter having a different configuration and performing a different process may be used. Furthermore, the DA converter 20 of the present embodiment is supplied with input data with a range from $-2^{(N-1)}$ to $2^{(N-1)}-1$, but the range of the input data is not limited to this, and may be a different range such as from 0 to $2^N-1$ or $-(2^N-1)$ to 0.

Figure 10:
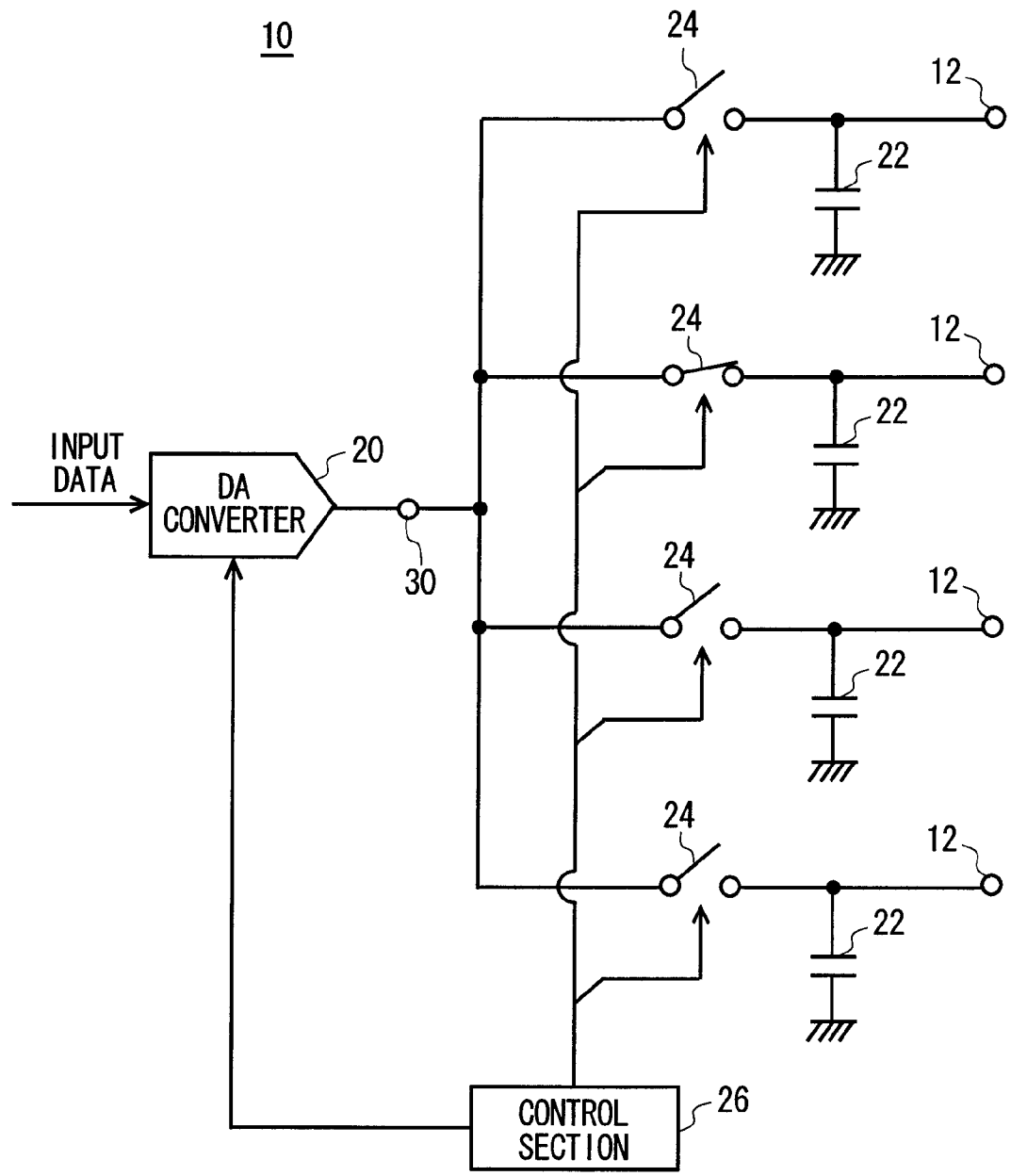
FIG. 10 shows a configuration of the signal generating apparatus 10 according to a first modification of the present embodiment.

FIG. 10 shows a configuration of the signal generating apparatus 10 according to a first modification of the present embodiment. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The signal generating apparatus 10 of the present modification is supplied with a plurality of pieces of input data corresponding respectively to a plurality of the output ends 12. The signal generating apparatus 10 outputs, from each of the output ends 12, a voltage according to the corresponding piece of input data.

The signal generating apparatus 10 of the present modification includes the DA converter 20, a plurality of the capacitor sections 22, a plurality of the transmission switches 24, and the control section 26. The capacitor sections 22 correspond respectively to the output ends 12. Each capacitor section 22 is provided between the corresponding output end 12 and a standard potential.

The transmission switches 24 correspond respectively to the output ends 12. Each capacitor section 22 provides a connection or a disconnect between the voltage generating end 30 of the DA converter 20 and the corresponding output end 12.

When input data is supplied to the signal generating apparatus 10, the control section 26 selects output ends 12 from among the plurality of output ends 12 to generate the voltage corresponding to the supplied input data. The control section 26 disconnects the transmission switches 24 corresponding to the output ends 12 that are not selected.

The control section 26 alternately connects and disconnects the transmission switches 24 corresponding to the selected output ends 12, thereby causing the voltages of the capacitor sections 22 corresponding to the selected output ends 12 to gradually approach the output voltage corresponding to the input data. In other words, the control section 26 controls the DA converter 20 and the transmission switches 24 corresponding to the selected output ends 12 in the same manner as in the signal generating apparatus 10 shown in FIG. 1. As a result, the control section 26 can generate the voltage corresponding to the supplied input data from designated output ends 12 from among the plurality of output ends 12.

When a plurality of pieces of input data are supplied to the signal generating apparatus 10 in parallel, the DA converter 20 may process the pieces of input data provided in parallel in an interleaved manner. As another example, the DA converter 20 may output voltages corresponding to the same input data simultaneously from a plurality of the output ends 12. In such a case, the control section 26 may switch in synchronization the transmission switches 24 corresponding to the output ends 12 from which the voltage is to be output simultaneously.

The signal generating apparatus 10 of the present modification can output a plurality of voltages in parallel while maintaining a small circuit size.

Figure 11:
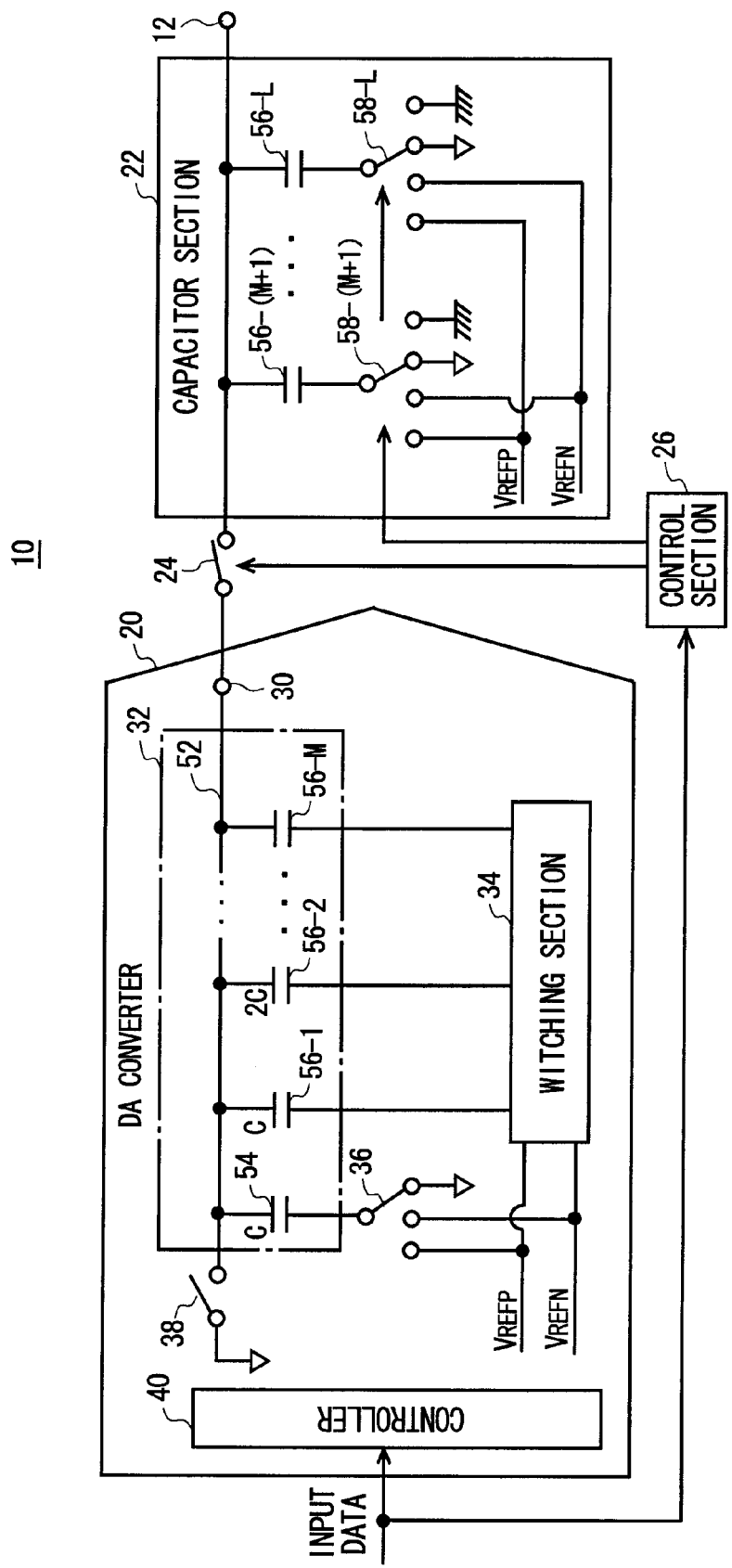
FIG. 11 shows a configuration of the signal generating apparatus 10 according to a second modification of the present embodiment.

FIG. 11 shows a configuration of the signal generating apparatus 10 according to a second modification of the present embodiment. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The capacitor array 32 of the DA converter 20 includes bit capacitors 56-1 to 56-M corresponding respectively to the first through M-th bits, where M is an integer greater than 1. The bit capacitors 56-1 to 56-M each have a capacitance corresponding to the weighting of the corresponding bit, and each have one end thereof connected to the output line 52, which is connected to the voltage generating end 30.

The capacitor section 22 has bit capacitors 56-(M+1) to 56-L and bit switches 58-(M+1) to 58-L corresponding respectively to the (M+1)-th to L-th bits, where L is an integer greater than M. Each of the bit capacitors 56-(M+1) to 56-L have a capacitance according to the weighting of the corresponding bit, and each have one end thereof connected to the line between the transmission switch 24 and the output end 12.

The bit switches 58-(M+1) to 58-L correspond respectively to the bit capacitors 56-(M+1) to 56-L. Each of the bit switches 58-(M+1) to 58-L connects the other end of the corresponding bit capacitor 56, which is the end not connected to the line between the transmission switch 24 and the output end 12, to one of the standard potential, the positive reference potential $V_{REFP}$, the negative reference potential $V_{REFN}$, and the common potential $V_{CM}$.

The control section 26 performs operational control by selecting one of a first mode and a second mode according to a setting from a user, for example. When the signal generating apparatus 10 operates in the first mode, the control section 26 controls the bit switches 58-(M+1) to 58-L to connect the other end of each of the bit capacitors 56-(M+1) to 56-L, which is the end that is not connected to the line between the transmission switch 24 and the output end 12, to the standard potential.

The control section 26 causes the DA converter 20 to charge the capacitor section 22 with a voltage corresponding to the input data by alternately connecting and disconnecting the transmission switch 24, and thereby causes the voltage of the capacitor section 22 to gradually approach the output voltage corresponding to the input data. As a result, the control section 26 can cause an output voltage with an M-bit resolution corresponding to the input data to be output from the output end 12, in the same manner as the signal generating apparatus 10 described in FIG. 1.

When the signal generating apparatus 10 operates in the second mode, the control section 26 keeps the transmission switch 24 in the connected state. The control section 26 causes the DA converter 20 and the capacitor section 22 to function as a single charge redistribution DA converter to generate an output voltage with an L-bit resolution corresponding to the input data from the output end 12 of the signal generating apparatus 10.

With this signal generating apparatus 10, a user can select whether the signal generating apparatus 10 functions as a charge redistribution DA converter or as a high-precision low-resolution DA converter, depending on the desired resolution, precision, and the like.

Figure 12:
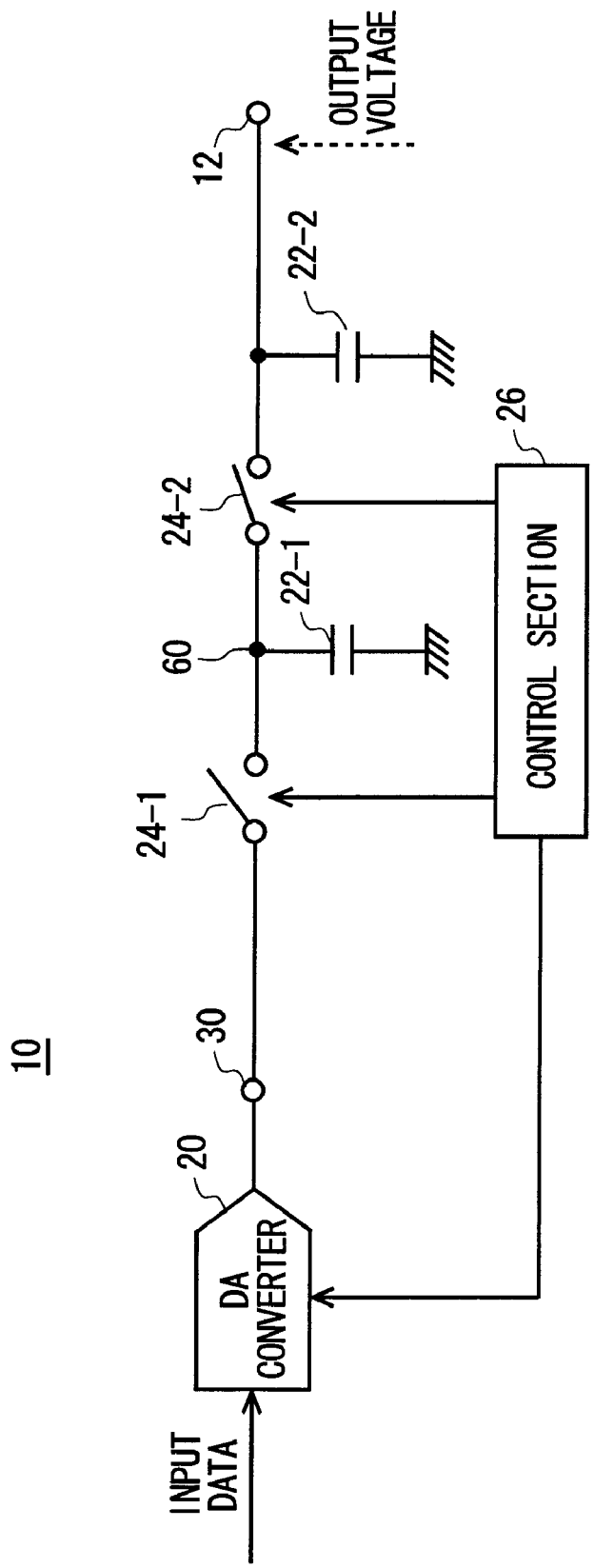
FIG. 12 shows a configuration of the signal generating apparatus 10 according to a third modification of the present embodiment.

FIG. 12 shows a configuration of the signal generating apparatus 10 according to a third modification of the present embodiment. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The signal generating apparatus 10 of the present embodiment includes the DA converter 20, a first capacitor section 22-1, a first transmission switch 24-1, a second capacitor section 22-2, a second transmission switch 24-2, and the control section 26. The first capacitor section 22-1 is provided between an intermediate node 60 and the standard potential. The first transmission switch 24-1 provides a connection or a disconnect between the voltage generating end 30 of the DA converter 20 and the intermediate node 60.

The second capacitor section 22-2 is provided between the output end 12 and the standard potential. The second transmission switch 24-2 provides a connection or a disconnect between the intermediate node 60 and the output end 12.

The control section 26 connects the first transmission switch 24-1 during at least a portion of the period of the output mode, and disconnects the first transmission switch 24-1 at other times. For example, the control section 26 may connect the first transmission switch 24-1 during the output mode and disconnect the first transmission switch 24-1 during the refresh mode.

The control section 26 connects the second transmission switch 24-2 for at least a portion of the period during which the first transmission switch 24-1 is disconnected, and disconnects the second transmission switch 24-2 at other times. For example, the control section 26 connects the second transmission switch 24-2 while the first transmission switch 24-1 is in the disconnected state and disconnects the second transmission switch 24-2 while the first transmission switch 24-1 is in the connected state.

The signal generating apparatus 10 of the present modification switches the first transmission switch 24-1 to alternately provide a connection and a disconnect between the first capacitor section 22-1 and the voltage generating end 30 of the DA converter 20, thereby causing the voltage of the first capacitor section 22-1 to approach the output voltage corresponding to the input data. At the same time, the signal generating apparatus 10 switches the second transmission switch 24-2 to alternately provide a connection and a disconnect between the first capacitor section 22-1 and the second capacitor section 22-2, thereby causing the voltage of the second capacitor section 22-1 to approach the voltage of the first capacitor section 22-1. As a result, the signal generating apparatus 10 of the present modification can output from the second capacitor section 22-2 an output voltage corresponding to the input data.

The signal generating apparatus 10 described above uses two capacitor sections 22 connected in parallel between the output end 12 and the standard potential to filter the noise occurring when the DA converter 20 switches between the refresh mode and the output mode, e.g. refresh noise, charge injection, and clock feedthrough caused by switch driving. Accordingly, the signal generating apparatus 10 of the present embodiment can decrease the noise to output a more accurate voltage. It should be noted that the signal generating apparatus 10 may include three or more capacitor sections 22 connected in parallel between the output end 12 and the standard potential.

Figure 13:
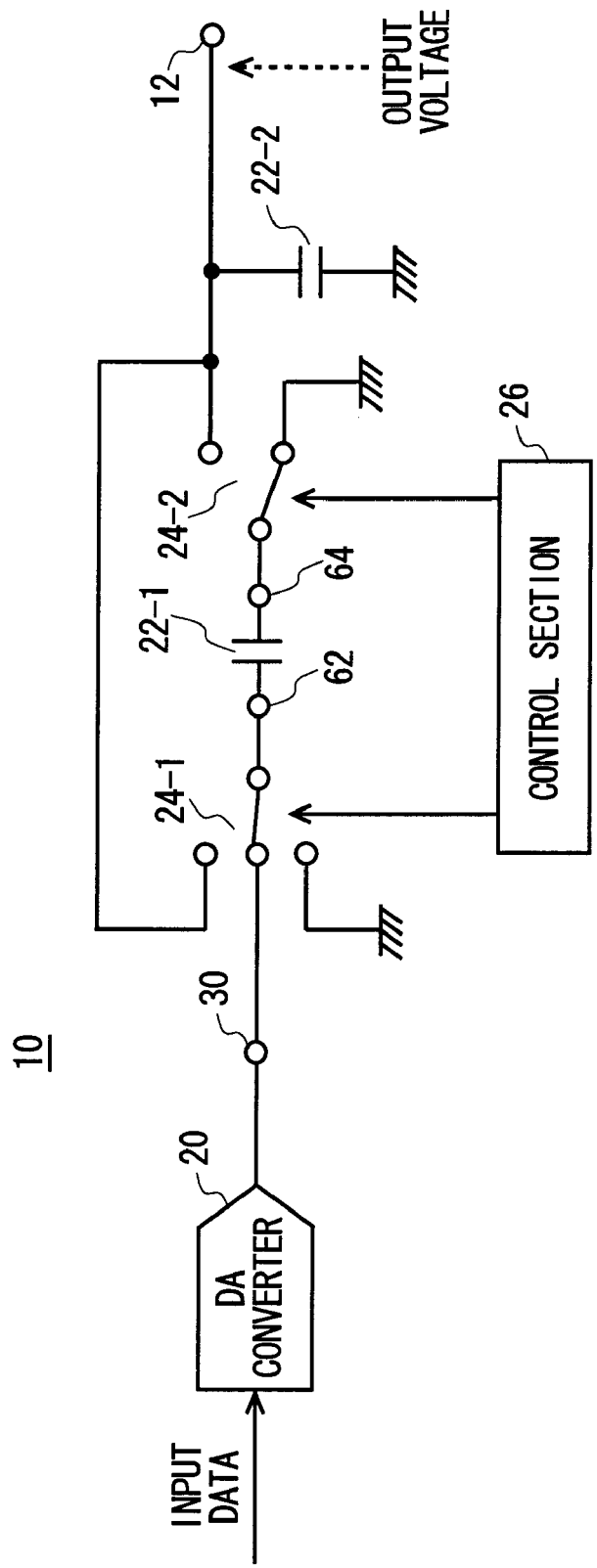
FIG. 13 shows a configuration of the signal generating apparatus 10 according to a fourth modification of the present embodiment.

FIG. 13 shows a configuration of the signal generating apparatus 10 according to a fourth modification of the present embodiment. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The signal generating apparatus 10 of the present modification can switch between outputting an inverted voltage of the voltage output from the DA converter 20 and a non-inverted voltage of the voltage output from the DA converter 20. The signal generating apparatus 10 of the present modification includes the DA converter 20, the first capacitor section 22-1, the second capacitor section 22-2, the first transmission switch 24-1, and the second transmission switch 24-2. The second capacitor section 22-2 is provided between the output end 12 and the standard potential.

The first transmission switch 24-1 is controlled by the control section 26 to provide a connection between (i) a first terminal 62 of the first capacitor section 22-1 and (ii) one of the output end 12, the standard potential, and the voltage generating end 30 of the DA converter 20. The second transmission switch 24-2 is controlled by the control section 26 to provide a connection between (i) a second terminal 64 of the first capacitor section 22-1 and (ii) one of the output end 12 and the standard potential.

In the signal generating apparatus 10 of the present modification, the control section 26 controls the first transmission switch 24-1 to connect the first terminal 62 of the first capacitor section 22-1 to the voltage generating end 30 of the DA converter 20 and controls the second transmission switch 24-2 to connect the second terminal 64 of the first capacitor section 22-1 to the standard potential during at least a portion of the period of the output mode. In this way, the control section 26 can transmit the charge accumulated in the DA converter 20 to the first capacitor section 22-1.

When a mode is set for outputting the non-inverted voltage, after the charge is transmitted to the first capacitor section 22-1, the control section 26 controls the first transmission switch 24-1 to connect the first terminal 62 of the first capacitor section 22-1 to the output end 12 and controls the second transmission switch 24-2 to connect the second terminal 64 of the first capacitor section 22-1 to the standard potential during an interval other than the portion of the output mode period described above. In this way, the control section 26 can transmit the charge accumulated in the first capacitor section 22-1 to the second capacitor section 22-2 without inverting the polarity. Accordingly, the signal generating apparatus 10 of the present modification can output from the output end 12 a non-inverted voltage of the voltage output from the DA converter 20, by repeatedly connecting and disconnecting the first transmission switch 24-1 and the second transmission switch 24-2.

When a mode is set for outputting the inverted voltage, after the charge is transmitted to the first capacitor section 22-1, the control section 26 controls the first transmission switch 24-1 to connect the first terminal 62 of the first capacitor section 22-1 to the standard potential and controls the second transmission switch 24-2 to connect the second terminal 64 of the first capacitor section 22-1 to the output end 12 during an interval other than the portion of the output mode period described above. In this way, the control section 26 can transmit the charge accumulated in the first capacitor section 22-1 to the second capacitor section 22-2 with an inverted polarity. Accordingly, the signal generating apparatus 10 of the present modification can output from the output end 12 an inverted voltage of the voltage output from the DA converter 20, by repeatedly connecting and disconnecting the first transmission switch 24-1 and the second transmission switch 24-2.

The signal generating apparatus 10 described above can switch between outputting an inverted voltage and a non-inverted voltage of the output voltage corresponding to the input data. Accordingly, even if the DA converter 20 uses a reference voltage with only one polarity, the signal generating apparatus 10 can cause the DA converter 20 to output voltage in the same manner as a DA converter 20 using a reference potential with both polarities. Furthermore, this signal generating apparatus 10 achieves the same effects as the signal generating apparatus 10 of the third modification shown in FIG. 12.

Figure 14:
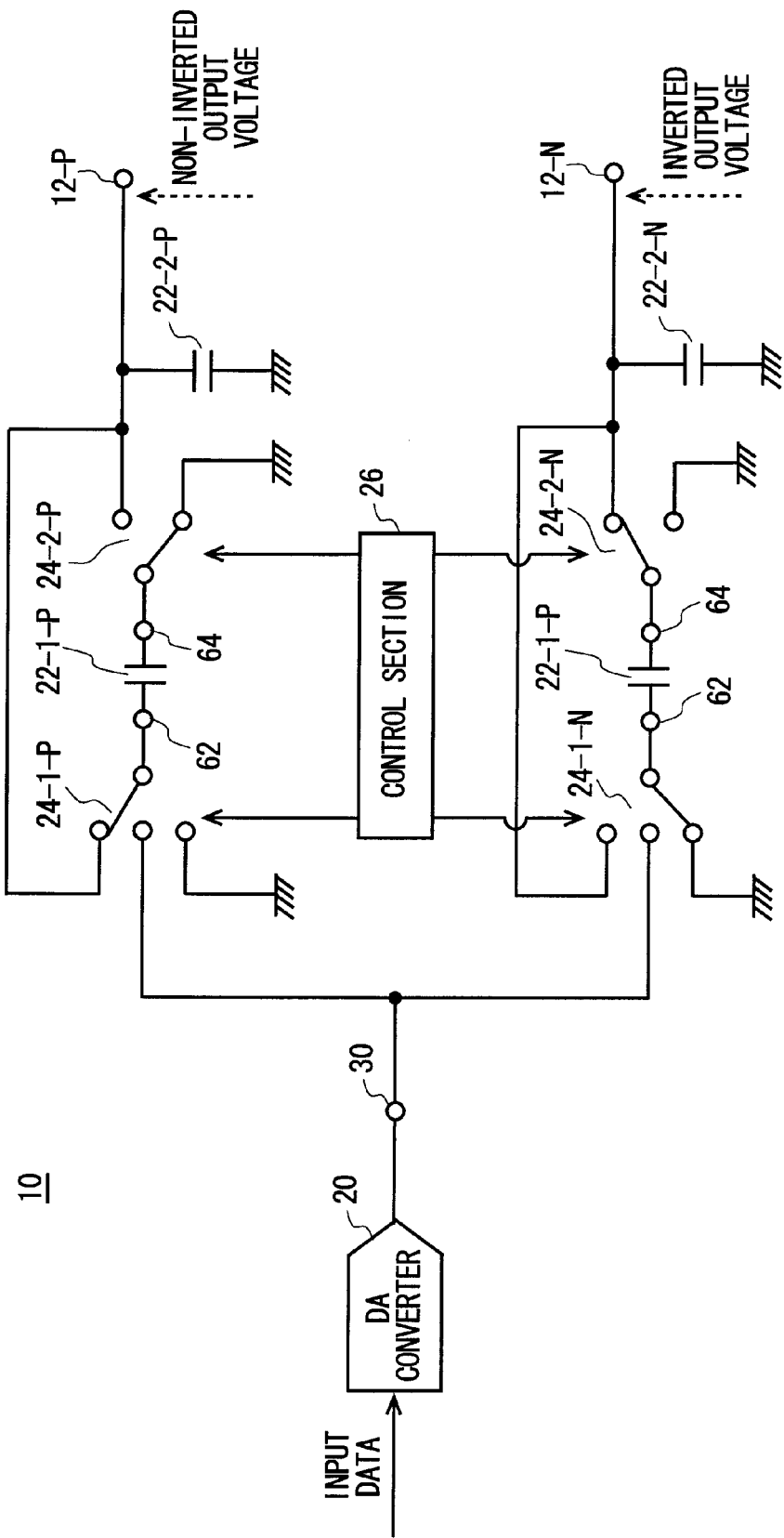
FIG. 14 shows a configuration of the signal generating apparatus 10 according to a fifth modification of the present embodiment.

FIG. 14 shows a configuration of the signal generating apparatus 10 according to a fifth modification of the present embodiment. The signal generating apparatus 10 of the present modification adopts substantially the same function and configuration as the signal generating apparatus 10 shown in FIG. 13, and so components that are the same as those of the signal generating apparatus 10 in FIG. 13 are given the same reference numerals and redundant description is omitted.

The signal generating apparatus 10 of the present modification can output a differential voltage according to the input data from a non-inversion output end 12-P and an inversion output end 12-N. More specifically, the signal generating apparatus 10 of the present modification outputs from the non-inversion output end 12-P the non-inverted voltage of the voltage output from the DA converter 20, and outputs from the inversion output end 12-N the inverted voltage of the voltage output from the DA converter 20.

The signal generating apparatus 10 includes the DA converter 20 and the control section 26. Furthermore, the signal generating apparatus 10 includes a non-inversion first capacitor section 22-1-P, a non-inversion second capacitor section 22-2-P, a non-inversion first transmission switch 24-1-P, and a non-inversion second transmission switch 24-2-P, which correspond to the non-inversion output end 12-P. The signal generating apparatus 10 also includes an inversion first capacitor section 22-1-N, an inversion second capacitor section 22-2-N, an inversion first transmission switch 24-1-N, and an inversion second transmission switch 24-2-N, which correspond to the inversion output end 12-N.

In the signal generating apparatus 10 of the present modification, the control section 26 switches the non-inversion first transmission switch 24-1-P and the non-inversion second transmission switch 24-2-P when in the mode for outputting the non-inverted voltage. In this way, the control section 26 can output from the non-inversion output end 12-P a non-inverted voltage of the voltage output from the DA converter 20.

The control section 26 switches the inversion first transmission switch 24-1-N and the inversion second transmission switch 24-2-N when in the mode for outputting the inverted voltage. In this way, the control section 26 can output from the inversion output end 12-N an inverted voltage of the voltage output from the DA converter 20.

The signal generating apparatus 10 described above can output a differential voltage corresponding to the input data. Therefore, the signal generating apparatus 10 can eliminate the effect of the in-phase noise such as the interference noise superimposed by the transmission line up to the second capacitor section 22-2, clock feedthrough caused by switch driving, charge injection, and the like.

In the present modification, the non-inversion first transmission switch 24-1-P need not be connected between the first terminal 62 of the non-inversion first capacitor section 22-1-P and the standard potential. Furthermore, the non-inversion second transmission switch 24-2-P need not be included, and the second terminal 64 of the non-inversion first capacitor section 22-1-P may be connected directly to the standard potential. Yet further, the inversion first transmission switch 24-1-N need not be connected between the first terminal 62 of the inversion first capacitor section 22-1-N and the non-inversion output end 12-N.

Figure 15:
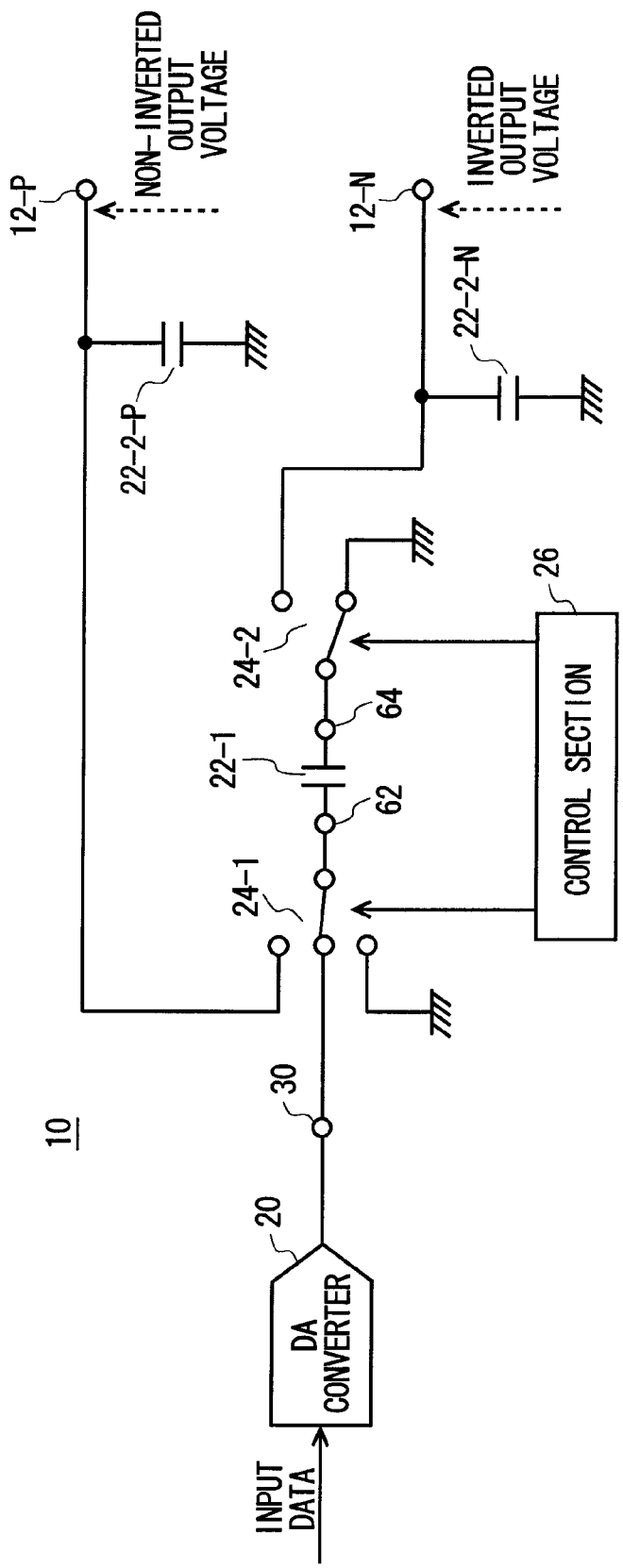
FIG. 15 shows a configuration of the signal generating apparatus 10 according to a sixth modification of the present embodiment.

FIG. 15 shows a configuration of the signal generating apparatus 10 according to a sixth modification of the present embodiment. The signal generating apparatus 10 of the present modification adopts substantially the same function and configuration as the signal generating apparatus 10 shown in FIG. 13, and so components that are the same as those of the signal generating apparatus 10 in FIG. 13 are given the same reference numerals and redundant description is omitted.

The signal generating apparatus 10 of the present modification can output a differential voltage according to the input data from the non-inversion output end 12-P and the inversion output end 12-N. More specifically, the signal generating apparatus 10 of the present modification outputs from the non-inversion output end 12-P the non-inverted voltage of the voltage output from the DA converter 20, and outputs from the inversion output end 12-N the inverted voltage of the voltage output from the DA converter 20.

The signal generating apparatus 10 includes the DA converter 20, the first capacitor section 22-1, the non-inversion second capacitor section 22-2-P, the inversion second capacitor section 22-2-N, the first transmission switch 24-1, and the second transmission switch 24-2. The non-inversion second capacitor section 22-2-P is provided between the non-inversion output end 12-P and the standard potential. The inversion second capacitor section 22-2-N is provided between the inversion output end 12-N and the standard potential.

The first transmission switch 24-1 is controlled by the control section 26 to provide a connection between (i) the first terminal 62 of the first capacitor section 22-1 and (ii) one of the non-inversion output end 12-P, the standard potential, and the voltage generating end 30 of the DA converter 20. The second transmission switch 24-2 is controlled by the control section 26 to provide a connection between (i) the second terminal 64 of the first capacitor section 22-1 and (ii) one of the inversion output end 12-N and the standard potential.

In the signal generating apparatus 10 of the present modification, the control section 26 controls the first transmission switch 24-1 to connect the first terminal 62 of the first capacitor section 22-1 to the voltage generating end 30 of the DA converter 20 and controls the second transmission switch 24-2 to connect the second terminal 64 of the first capacitor section 22-1 to the standard potential during at least a portion of the period of the output mode. In this way, the control section 26 can transmit the charge accumulated in the DA converter 20 to the first capacitor section 22-1.

Furthermore, in the signal generating apparatus 10, the control section 26 switches between an operation for charging the non-inversion second capacitor section 22-2-P with a non-inverted voltage and an operation for charging the inversion second capacitor section 22-2-N with an inverted voltage, during a time other than the above portion of the output mode period.

When charging the non-inversion second capacitor section 22-2-P with the non-inverted voltage, the control section 26 connects the first terminal 62 of the first capacitor section 22-1 to the non-inversion output end 12-P and connects the second terminal 64 of the first capacitor section 22-1 to the standard potential. When charging the inversion second capacitor section 22-2-N with the inverted voltage, the control section 26 connects the first terminal 24-1 of the first capacitor section 22-1 to the standard potential and connects the second terminal 64 of the first capacitor section 22-1 to the inversion output end 22-2-N.

The signal generating apparatus 10 described above can output a differential voltage corresponding to the input data. Therefore, the signal generating apparatus 10 can eliminate the effect of the in-phase noise such as the interference noise superimposed by the transmission line up to the second capacitor section 22-2, clock feedthrough caused by switch driving, charge injection, and the like.

Figure 16:
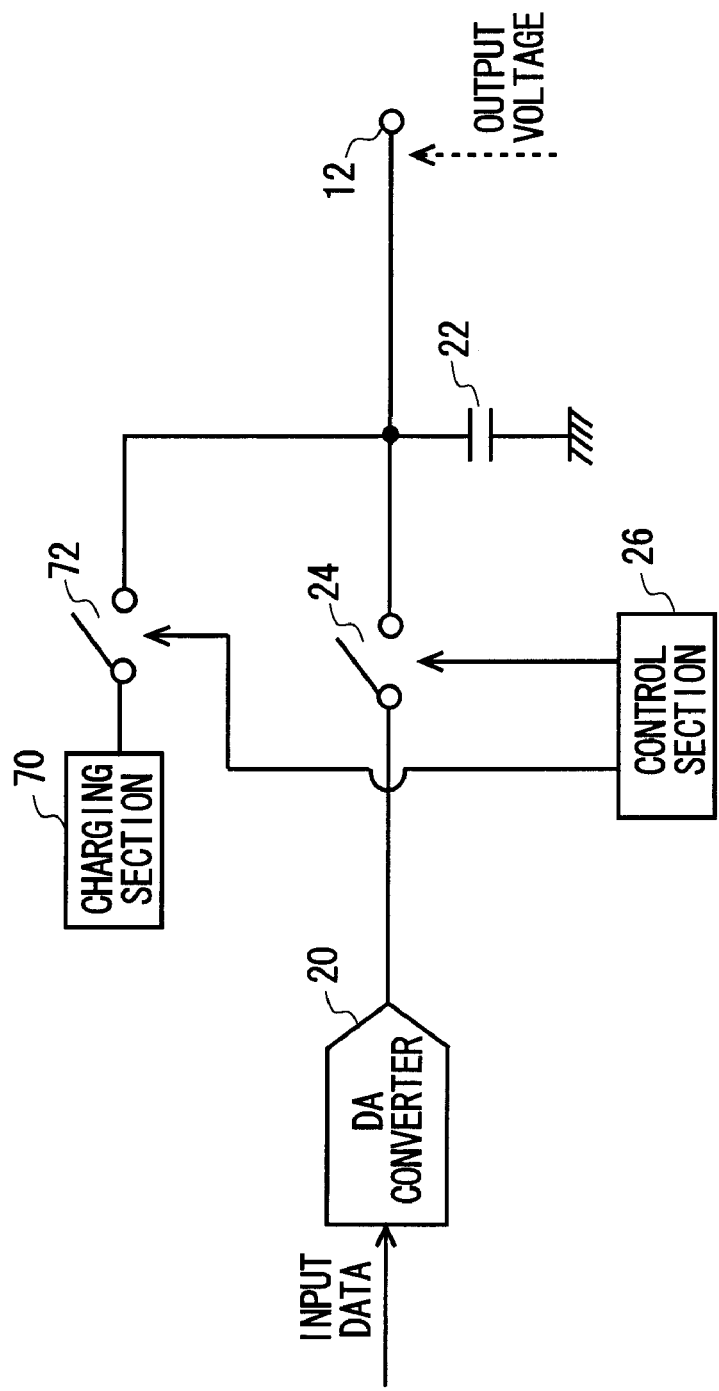
FIG. 16 shows a configuration of the signal generating apparatus 10 according to a seventh modification of the present embodiment.

FIG. 16 shows a configuration of the signal generating apparatus 10 according to a seventh modification of the present embodiment. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The signal generating apparatus 10 of the present modification further includes a charging section 70 and a charging switch 72. The charging section 70 charges the capacitor section 22. The charging switch 72 switches whether the charging section 70 is connected to the capacitor section 22.

Prior to or in parallel with charging the capacitor section 22 with the DA converter 20, the control section 26 charges the capacitor section 22 with the charging section 70. For example, the control section 26 may control the charging switch 72 to switch whether the charging section 70 charges the capacitor section 22.

In this case, the control section 26 may change the charge amount of the charging section 70 according to a difference between the input data supplied thereto and the input data supplied thereto in the previous sample. For example, the control section 26 may lengthen the charge time or increase the current generated by the charging section 70 when there is a large difference between the input data supplied thereto and the input data supplied thereto in the previous sample. The signal generating apparatus 10 of the present modification can shorten the time necessary for the capacitor section 22 to be charged to the voltage corresponding to the input data.

Figure 17:
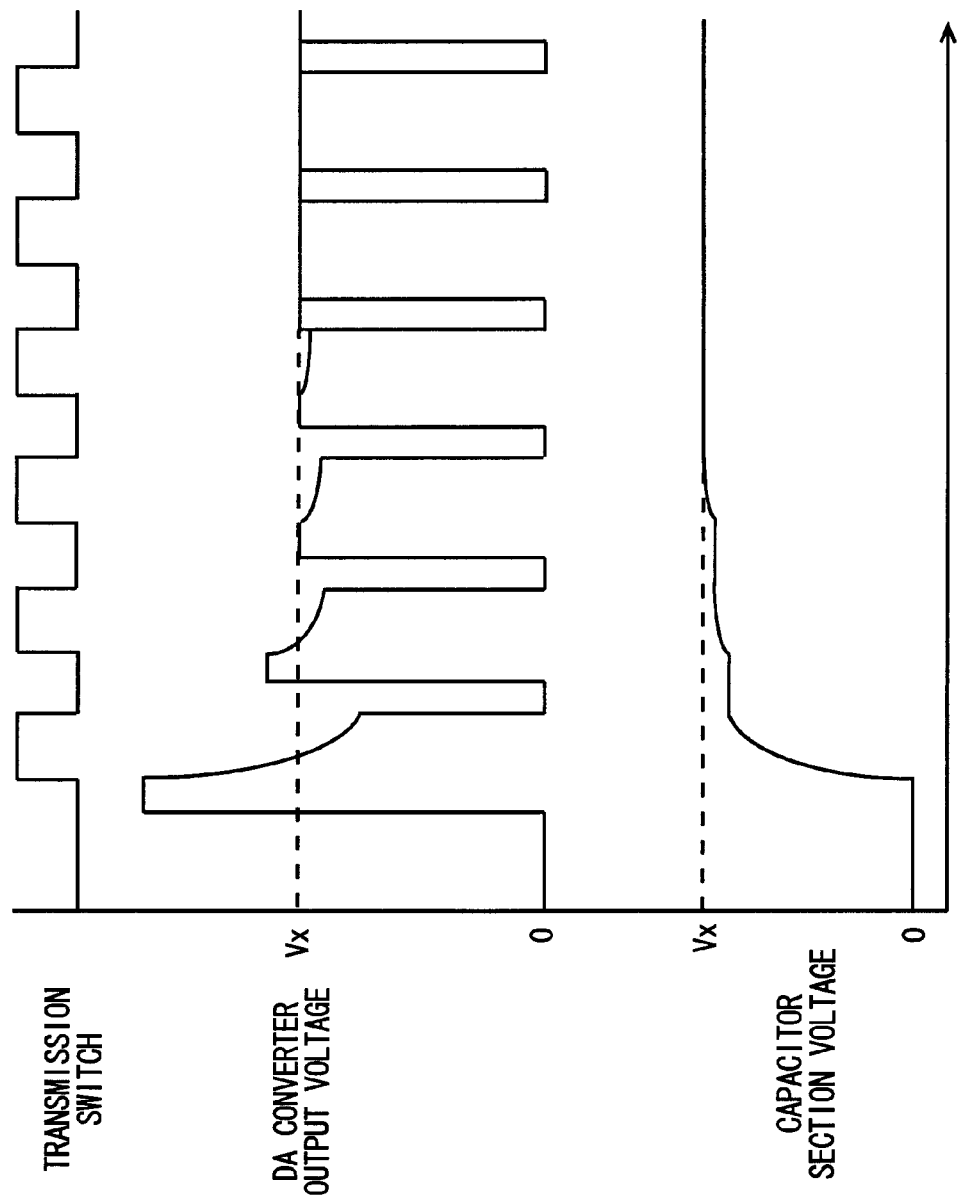
FIG. 17 shows an exemplary voltage waveform of each node and a switching timing of the transmission switch 24 in the signal generating apparatus 10 according to an eighth modification of the present embodiment.

FIG. 17 shows an exemplary voltage waveform of each node and a switching timing of the transmission switch 24 in the signal generating apparatus 10 according to an eighth modification of the present embodiment. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The DA converter 20 repeatedly switches between the refresh mode and the output mode according to the supply of input data thereto. The control section 26 disconnects the transmission switch 24 during the refresh mode and connects the transmission switch 24 during the output mode to charge the capacitor section 22.

Here, the DA converter 20 of the present modification outputs a voltage that is obtained by correcting the output voltage corresponding to the input data at an initial stage in the cycle of the refresh mode and the output mode repeating according to the supply of the input data.

For example, as shown in FIG. 17, the DA converter 20 outputs a voltage that is greater than (or less than) the voltage $V_X$ corresponding to the input data at an initial stage of the repeating cycle of the refresh mode and the output mode. The DA converter 20 causes the output voltage to approach the voltage $V_X$ corresponding to the input data as the repeating cycle progresses, so as to output the voltage $V_X$ corresponding to the input data at the final stage of the repeating cycle.

Furthermore, in this case, the control section 26 may change the output voltage output at the initial stage of the cycle according to the difference between the input data supplied thereto and the input data supplied thereto in the previous sample. For example, the control section 26 may change the voltage output at the initial stage of the cycle such that the difference between the output voltage and the voltage $V_X$ corresponding to the input data is greater when the difference between the input data supplied thereto and the input data supplied thereto in the previous sample is greater. The signal generating apparatus 10 according to the present modification can decrease the time necessary for charging the capacitor section 22 to the voltage corresponding to the input data.

Furthermore, the signal generating apparatus 10 of the present modification may be set from the outside to operate in a high-speed mode that shortens the time necessary for reaching the voltage corresponding to the input data or a low-speed mode that lengthens the time necessary for reaching the voltage corresponding to the input data. In this case, the capacitor section 22 can be switched between a first capacitance and a second capacitance, which is larger than the first capacitance.

The control section 26 switches the capacitor section 22 to be the first capacitance when operating in the high-speed mode and switches the capacitor section 22 to the second capacitance when operating in the low-speed mode. In this way, the signal generating apparatus 10 can decrease the capacitance of the capacitor section 22 in the high-speed mode to shorten the time necessary for reaching the voltage corresponding to the input data and can increase the capacitance of the capacitor section 22 in the low-speed mode to lengthen the time necessary for reaching the voltage corresponding to the input data.

Figure 18:
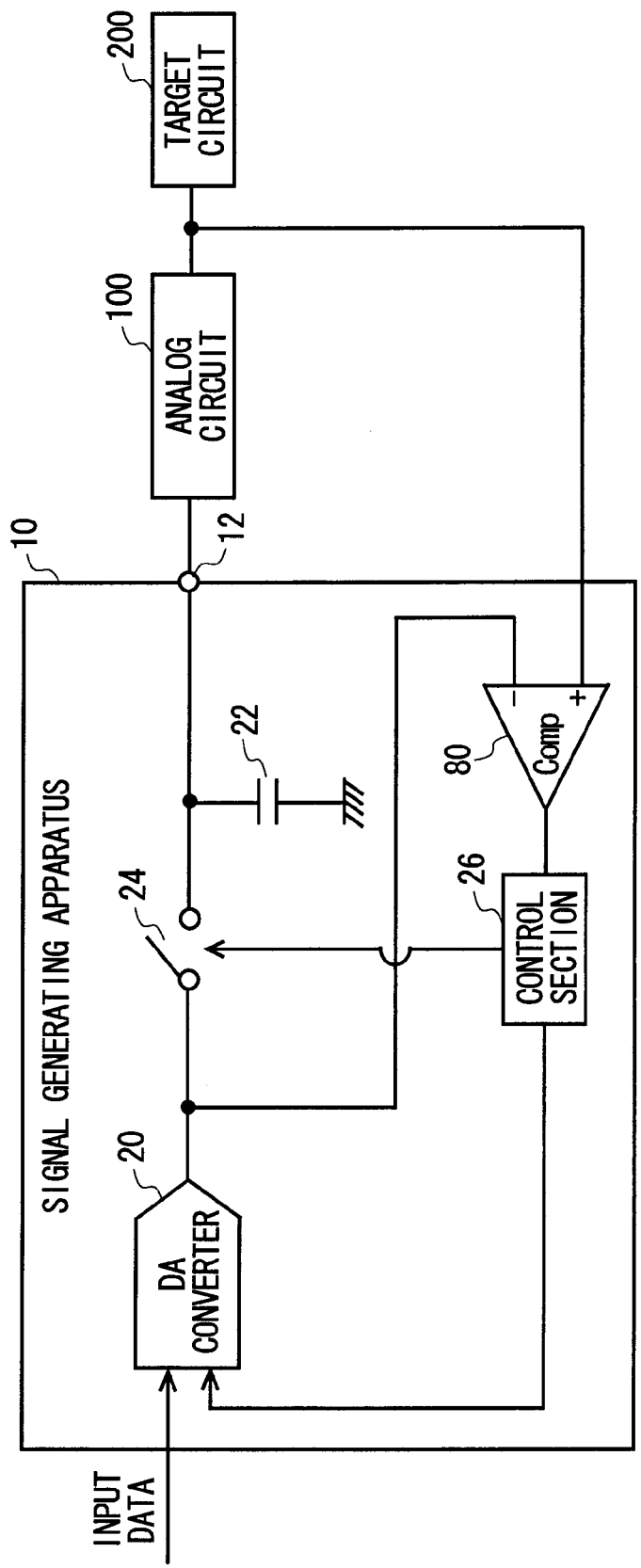
FIG. 18 shows a configuration of the signal generating apparatus 10 according to a ninth modification of the present embodiment, together with an analog circuit 100 and a target circuit 200.

FIG. 18 shows a configuration of the signal generating apparatus 10 according to a ninth modification of the present embodiment, together with an analog circuit 100 and a target circuit 200. The signal generating apparatus 10 of the present modification adopts substantially the same function and configuration as the signal generating apparatus 10 shown in FIG. 1, and so components that are the same as those of the signal generating apparatus 10 in FIG. 1 are given the same reference numerals and redundant description is omitted.

The signal generating apparatus 10 of the present modification supplies the target circuit 200 with a generated output voltage via the analog circuit 100. The analog circuit 100 propagates an output signal to output a signal having a level corresponding to the output signal. The analog circuit 100 may be a transmission line, for example. As another example, the analog circuit 100 may be a circuit including a low-pass filter that removes a high-frequency component from the output signal and a buffer amplifier that supplies the target circuit 200 with a signal output from the low-pass filter.

The analog circuit 100 may be formed integrally with the signal generating apparatus 10 on the same chip or substrate, for example. The analog circuit 100 may be provided within the signal generating apparatus 10.

The signal generating apparatus 10 of the present modification is further provided with a comparing section 80. The comparing section 80 compares (i) the voltage of the signal output from the analog circuit 100 that propagates the output voltage of the output end 12 to (ii) the voltage output by the DA converter 20. In other words, the comparing section 80 outputs a comparison result indicating which of the voltage of the signal output by the analog circuit 100 and the voltage output by the DA converter 20 is larger. The comparing section 80 supplies the comparison result to the control section 26.

Figure 19:
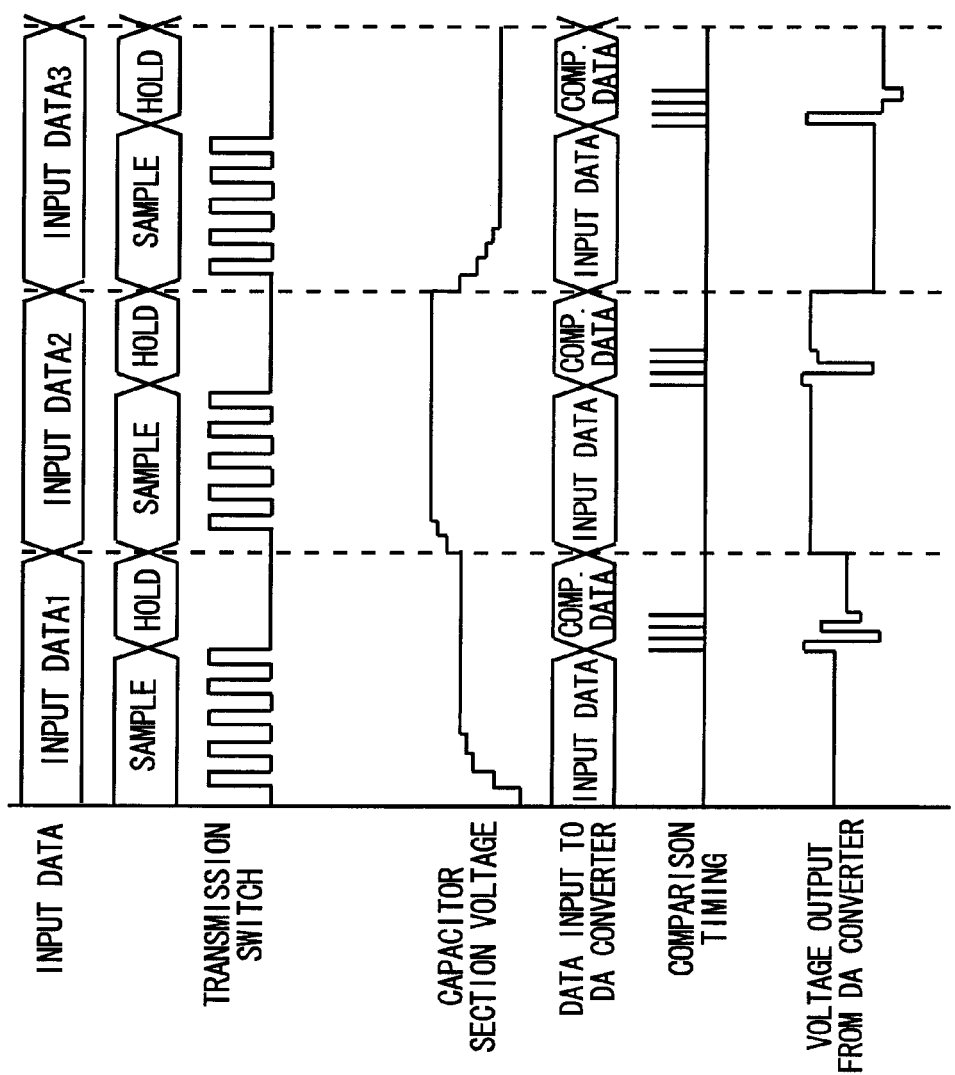
FIG. 19 shows examples of a timing chart and voltage waveforms of the signal generating apparatus 10 according to the ninth modification of the present embodiment.

FIG. 19 shows examples of a timing chart and voltage waveforms of the signal generating apparatus 10 according to the ninth modification of the present embodiment. The control section 26 of the sixth modification performs the operations of a sample mode and then the operations of a hold mode each time input data is supplied thereto.

First, when the input data is supplied, the control section 26 performs the operations of the sample mode. During the sample mode, the control section 26 causes the DA converter 20 to charge the capacitor section 22 with a voltage corresponding to the input data by alternately connecting and disconnecting the transmission switch 24, and thereby causes the voltage of the capacitor section 22 to gradually approach the output voltage corresponding to the input data. In other words, during the sample mode, the control section 26 performs the same process as in the signal generating apparatus 10 shown in FIG. 1. In this way, the control section 26 can charge the capacitor section 22 to a voltage corresponding to the input data.

Next, during the hold mode, the control section 26 disconnects the transmission switch 24. With the transmission switch 24 in the disconnected state, the control section 26 supplies the DA converter 20 with comparison data instead of the input data. The control section 26 causes the DA converter 20 to output a comparison voltage corresponding to the comparison data, causes the comparing section 80 to compare the comparison voltage to the voltage of the signal output from the analog circuit 100, and detects the voltage of the signal output from the analog circuit 100 based on the comparison result.

For example, the control section 26 may supply the DA converter 20 with comparison data that changes according to a prescribed rule for each clock, and cause the comparing section 80 to sequentially compare the voltage of the signal output from the analog circuit 100 to each of a plurality of different comparison voltages. The control section 26 then detects the voltage of the signal output from the analog circuit 100 based on the plurality of comparison results.

The control section 26 may increase or decrease the comparison data by 1 for each clock, and thereby cause the DA converter 20 to output a comparison voltage that increases or decreases by prescribed steps. In this case, the control section 26 detects the voltage of the signal output from the analog circuit 100 on a condition that the comparison result has changed from the immediately prior clock.

As another example, the control section 26 may supply the DA converter 20 with comparison data that changes according to a binary search. In this case, the control section 26 determines the comparison data in a certain clock based on the comparison data and the comparison result of the immediately prior clock. The control section 26 then judges the voltage of the signal output from the analog circuit 100 on a condition that the comparison results for a certain number of bits of the comparison data are obtained.

The control section 26 adjusts the output voltage of the DA converter 20 based on the voltage of the signal output from the analog circuit 100 and detected in the manner described above. For example, the control section 26 may adjust the output voltage of the DA converter 20 such that the voltage of a signal output from the analog circuit 100 corresponding to predetermined input data becomes a predetermined value. For example, the control section 26 may adjust the offset and gain of the output voltage of the DA converter 20.

The signal generating apparatus 10 according to the present modification can detect the voltage of the signal output by the analog circuit 100 without using a separate AD converter and while operating in the background of the signal generation process for outputting the output voltage corresponding to the input data. Therefore, the signal generating apparatus 10 of the present modification can appropriately adjust the voltage of the signal output by the analog circuit 100 during the signal generation process. Accordingly, even if the characteristics of the analog circuit 100 change during the signal generation process due to drift or the like, the signal generating apparatus 10 of the present modification can maintain a suitable value for the voltage of the signal output from the analog circuit 100.

Figure 20:
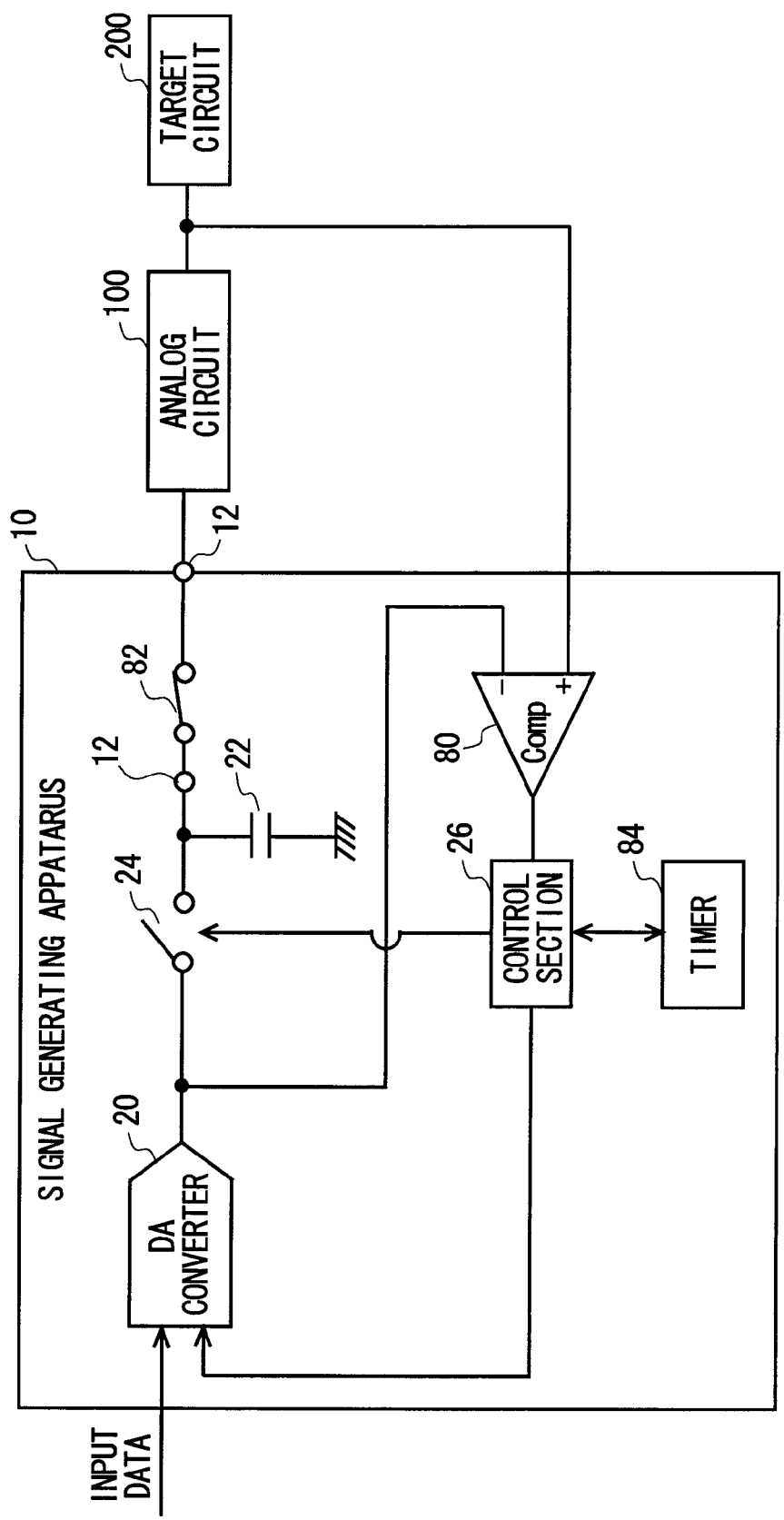
FIG. 20 shows a configuration of the signal generating apparatus 10 according to the tenth modification of the present embodiment, together with the analog circuit 100 and the target circuit 200.

FIG. 20 shows a configuration of the signal generating apparatus 10 according to a tenth modification of the present embodiment, together with the analog circuit 100 and the target circuit 200. The signal generating apparatus 10 of the present modification adopts substantially the same function and configuration as the signal generating apparatus 10 shown in FIG. 18, and so components that are the same as those of the signal generating apparatus 10 in FIG. 18 are given the same reference numerals and redundant description is omitted.

The control section 26 of the seventh modification performs a calibration prior to or during the signal generation process. The signal generating apparatus 10 of the present modification further includes an output switch 82 and a timer 84.

The output switch 82 provides a connection or a disconnect between the output end 12, which is the connection point of the capacitor section 22 and the transmission switch 24, and the input end of the analog circuit 100. The output switch 82 is connected during the signal generation process. During calibration, the output switch 82 is connected or disconnected by the control section 26. The timer 84 measures time according to instructions from the control section 26.

Figure 21:
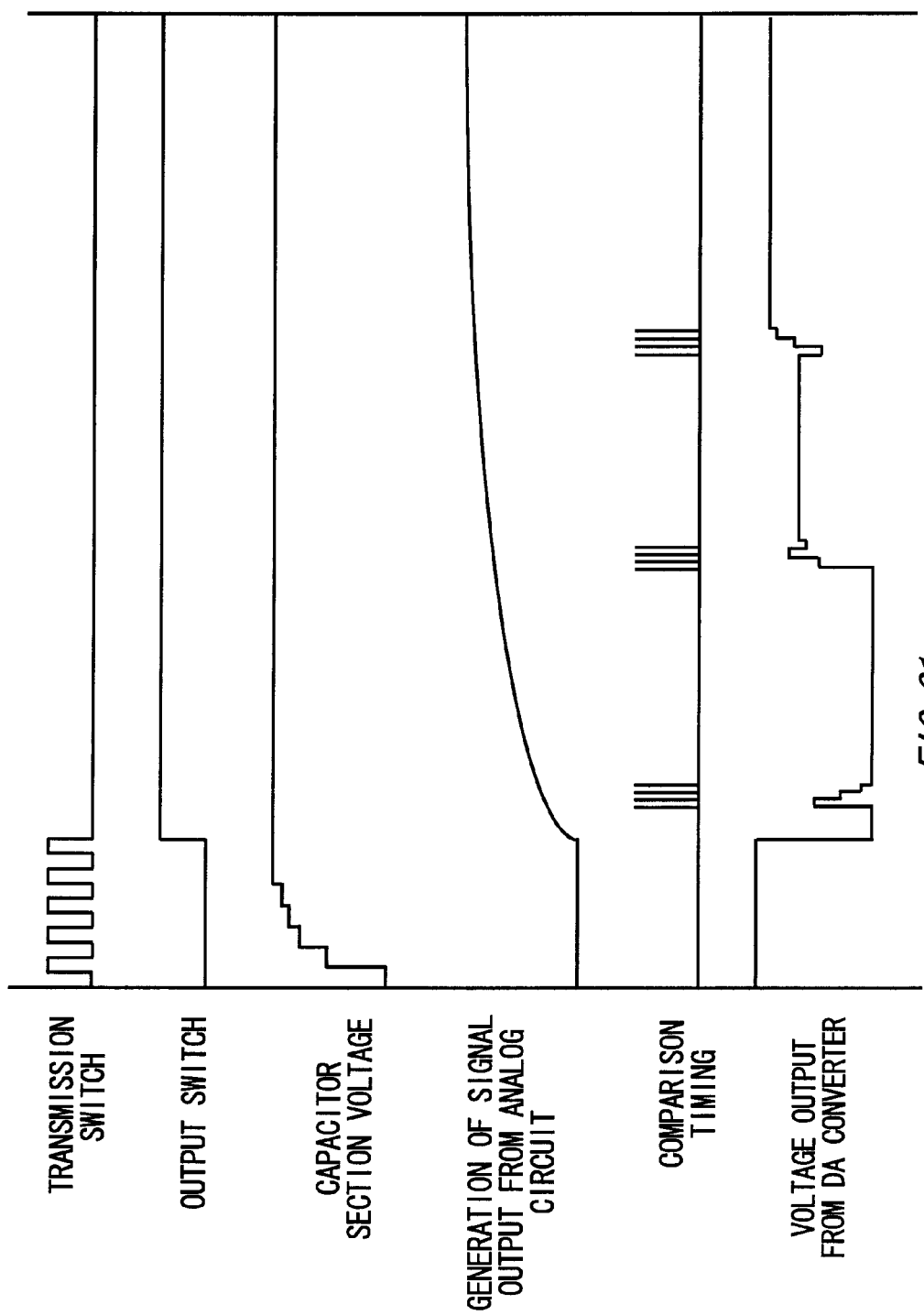
FIG. 21 shows first examples of the voltage waveform of each node and the switching timing of each switch in the signal generating apparatus 10 according to the tenth modification of the present embodiment.

FIG. 21 shows first examples of the voltage waveform of each node and the switching timing of each switch in the signal generating apparatus 10 according to the tenth modification of the present embodiment. The control section 26 of the seventh modification performs the operations of the sample mode and then the operations of the hold mode during calibration.

First, the control section 26 disconnects the output switch 82. The control section 26 then causes the DA converter 20 to charge the capacitor section 22 with a voltage corresponding to predetermined setting data by repeatedly connecting and disconnecting the transmission switch 24, and thereby causes the voltage of the capacitor section 22 to gradually approach the output voltage corresponding to the setting data.

In other words, during the sample mode, the control section 26 performs the same process as in the signal generating apparatus 10 shown in FIG. 1, except that the DA converter 20 is supplied with the setting data with the output switch 82 in the disconnected state. In this way, the control section 26 can charge the capacitor section 22 to a setting voltage corresponding to the setting data.

Next, the control section 26 performs the operations of the hold mode. During the hold mode, the control section 26 disconnects the transmission switch 24 and connects the output switch 82. In other words, the control section 26 supplies the analog circuit 100 with the setting voltage from the capacitor section 22.

During the hold mode, the control section 26 uses the DA converter 20 and the comparing section 80 to measure the settling waveform, i.e. the voltage waveform from when a change begins to when stabilization is achieved, of the voltage output from the analog circuit 100 in a case where the setting voltage is supplied to the analog circuit 100 from the capacitor section 22. For example, the control section 26 may supply the DA converter 20 with comparison data that changes according to a binary search at each of one or more measurement timings after a prescribed time has passed from a reference timing, i.e. a timing at which the analog circuit 100 is supplied with the setting voltage, and detect the voltage output from the analog circuit 100. The control section 26 then estimates the settling waveform based on the one or more measurement timings and the voltage detected at each of these measurement timings.

The control section 26 corrects the output voltage of the DA converter 20 during the signal generation process based on the settling waveform of the analog circuit 100 measured in the manner described above. For example, the control section 26 may estimate the transfer characteristic of the analog circuit 100 based on the settling waveform of the analog circuit 100 measured as described above. The control section 26 may then compensate the output voltage output from the DA converter 20 during the signal generation process using the inverse characteristic of the estimated transfer characteristic.

The signal generating apparatus 10 of the present modification described above can detect the settling waveform of the voltage output by the analog circuit 100 when a predetermined setting voltage is supplied thereto, without using a separate AD converter, and can adjust the signal output from the DA converter 20 based on the detected settling waveform. Even if the analog circuit 100 causes attenuation or degradation of the signal, the signal generating apparatus 10 of the present modification can cause the appropriate voltage to be output from the analog circuit 100.

Figure 22:
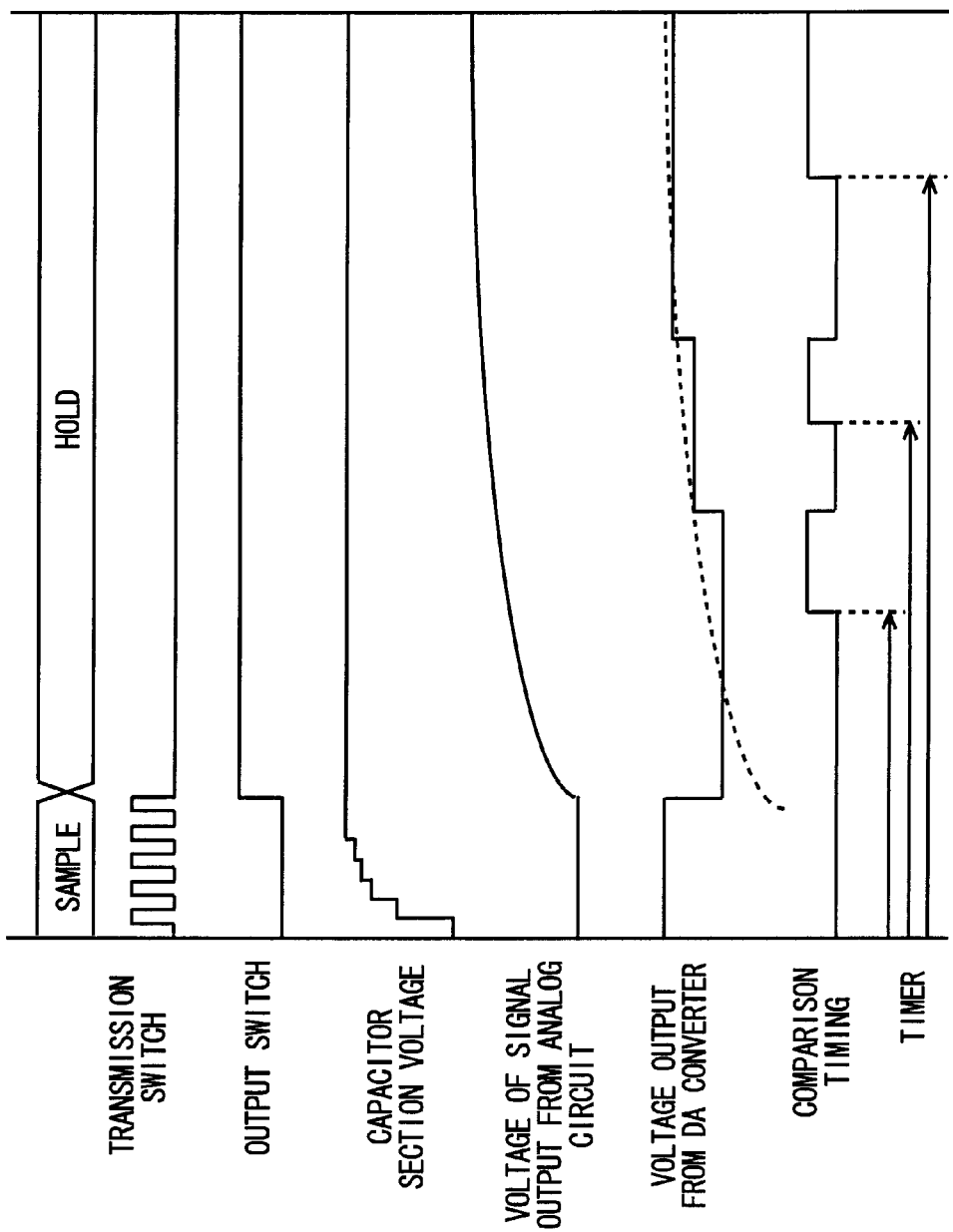
FIG. 22 shows second examples of the voltage waveform of each node and the switching timing of each switch in the signal generating apparatus 10 according to the tenth modification of the present embodiment.

FIG. 22 shows second examples of the voltage waveform of each node and the switching timing of each switch in the signal generating apparatus 10 according to the tenth modification of the present embodiment. The control section 26 of the signal generating apparatus of the tenth modification measures the settling waveform of the voltage output from the analog circuit 100 during the holding mode, using the method described in relation to FIG. 22. The control section 26 causes the DA converter 20 to output a first comparison voltage by supplying first comparison data thereto. The control section 26 causes the comparing section 80 to compare the voltage output by the analog circuit 100 to the first comparison voltage, and detects a first change timing at which the comparison result of the comparing section 80 changes.

After detecting the first change timing, the control section 26 causes the DA converter 20 to output a second comparison voltage, which is different from the first comparison voltage, by supplying second comparison data thereto. The control section 26 causes the comparing section 80 to compare the voltage output by the analog circuit 100 to the second comparison voltage, and detects a second change point at which the comparison result of the comparing section 80 changes.

In this way, the control section 26 can detect a timing at which the voltage of the signal output from the analog circuit 100 exceeds each of the predetermined comparison voltages. The control section 26 can then measure the settling waveform based on the one or more predetermined comparison voltages and each timing at which the voltage output by the analog circuit 100 exceeds one of the predetermined comparison voltages.

Figure 23:
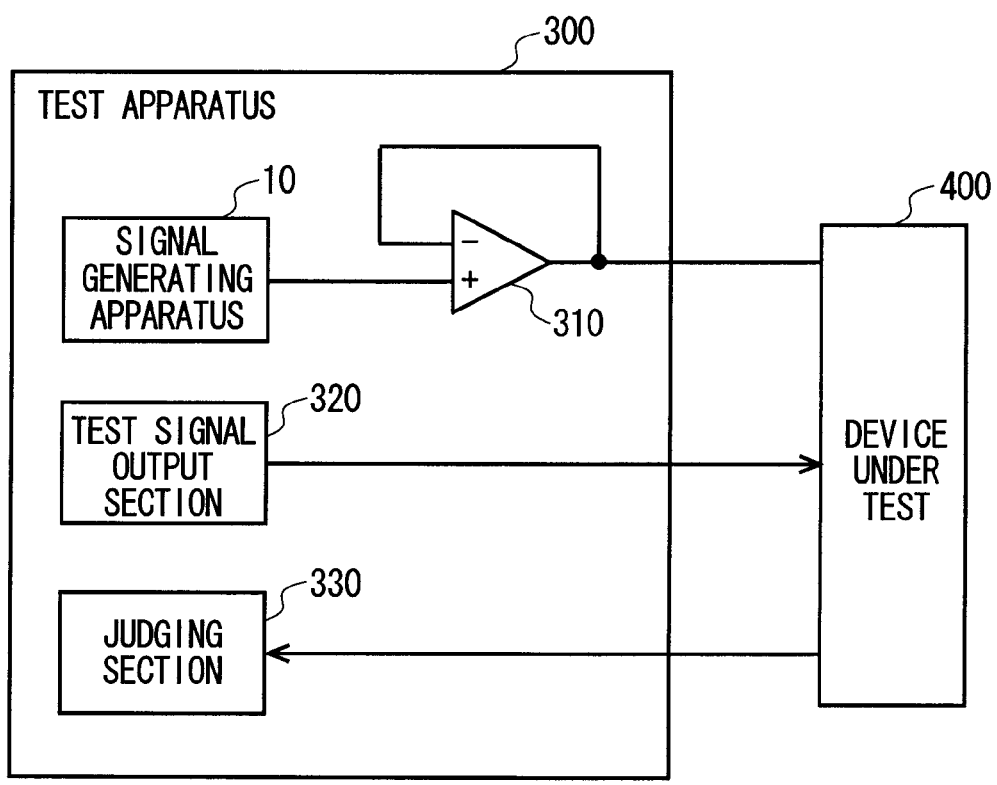
FIG. 23 shows a configuration of a test apparatus 300 according to an embodiment of the present invention, along with a device under test 400.

FIG. 23 shows a configuration of a test apparatus 300 according to an embodiment of the present invention, along with a device under test (DUT) 400. The test apparatus 300 tests the device under test 400, which may be a semiconductor apparatus or the like.

The test apparatus 300 includes the signal generating apparatus 10, a drive section 310, a test signal output section 320, and a judging section 330. The signal generating apparatus 10 generates the voltage to be supplied to the device under test 400. The signal generating apparatus 10 may have the same function and configuration as any one of the signal generating apparatuses 10 described in relation to FIGS. 1 to 22, and therefore further description is omitted.

The drive section 310 supplies the device under test 400 with the voltage generated by the signal generating apparatus 10. The drive section 310 may be a power amplifier, for example.

If the signal generating apparatus 10 adopts the configuration shown in FIG. 18 or FIG. 20, the drive section 310 may be a portion of the analog circuit 100. In this case, the signal generating apparatus 10 may compare the comparison voltage to the voltage of the output end of the drive section 310.

The test signal output section 320 outputs a test signal to the device under test 400. The judging section 330 receives a response signal from the device under test 400 in response to the test signal. The judging section 330 judges acceptability of the device under test 400 based on the received response signal. With this test apparatus 300, the signal generating apparatus 10 can be used to supply the device under test 400 with an accurate voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal generating apparatus that outputs from an output end thereof an output voltage corresponding to input data supplied thereto, comprising:
   a DA converter that outputs a voltage corresponding to data supplied thereto;
   a capacitor section that is provided between the output end and a standard potential;
   a transmission switch that provides a connection or a disconnect between a voltage generating end of the DA converter and the output end; and
   a control section that causes the DA converter to charge the capacitor section with a voltage corresponding to the input data by repeatedly connecting and disconnecting the transmission switch, thereby causing the voltage of the capacitor section to gradually approach the output voltage corresponding to the input data, wherein
   the DA converter includes:
      a capacitor array that is connected to the voltage generating end;
      a switching section that switches connection of the capacitor array; and
      a controller,
   during a refresh mode, the controller charges the capacitor array to a reference potential, and
   during an output mode that follows the refresh mode, the controller switches a ratio between (i) a capacitance between the voltage generating end and a common potential in the capacitor array and (ii) a capacitance between the voltage generating end and the reference potential in the capacitor array, according to data supplied thereto, thereby causing a voltage corresponding to the data supplied thereto to be generated from the voltage generating end.

2. The signal generating apparatus according to claim 1, wherein
   when input data is supplied to the signal generating apparatus, the DA converter repeatedly alternates between the refresh mode and the output mode for generating from the voltage generating end the voltage corresponding to the input data, and
   the control section connects the transmission switch during at least a portion of a period of the output mode.

3. The signal generating apparatus according to claim 2, wherein
   the capacitor section has a capacitance greater than the total capacitance of the capacitor array.

4. The signal generating apparatus according to claim 1, wherein
   the signal generating apparatus is supplied with a plurality of pieces of input data corresponding respectively to a plurality of the output ends, and outputs from each of the output ends a voltage according to the corresponding piece of input data,
   the signal generating apparatus comprises:
      a plurality of the capacitor sections corresponding respectively to the plurality of output ends; and
      a plurality of the transmission switches corresponding respectively to the plurality of output ends, and
   when input data is supplied to the signal generating apparatus, the control section repeatedly connects and disconnects the transmission switch corresponding to a selected output end from among the plurality of output ends to cause the voltage of the capacitor section corresponding to the selected output end to gradually approach the output voltage corresponding to the input data.

5. The signal generating apparatus according to claim 4, wherein
the control section disconnects the transmission switches corresponding to output ends that are not selected from among the plurality of output ends.

6. The signal generating apparatus according to claim 1, wherein
the signal generating apparatus switches between operating in a first mode and operating in a second mode for outputting the output voltage corresponding to input data having a higher resolution than input data of the first mode,
the capacitor array includes first through M-th bit capacitors that correspond to first through M-th bits, and that each have a capacitance according to a weighting of the corresponding bit and have one end thereof connected to an output line that is connected to the voltage generating end,
the capacitor section includes (M+1)-th through L-th bit capacitors that correspond to (M+1)-th through L-th bits, and that each have a capacitance according to a weighting of the corresponding bit and have one end thereof connected to a line between the transmission switch and the output end,
during the first mode, the control section connects an other end of each of the (M+1)-th through L-th bit capacitors, which is the end that is not connected to the line between the transmission switch and the output end, to a standard potential, and causes the DA converter to charge the capacitor section with a voltage corresponding to the input data by repeatedly connecting and disconnecting the transmission switch, thereby causing the voltage of the capacitor section to gradually approach the output voltage corresponding to the input data, and
during the second mode, the control section connects the transmission switch and causes the DA converter and the capacitor section to function as a single charge redistribution DA converter to generate from the output end of the signal generating apparatus the output voltage corresponding to the input data.

7. The signal generating apparatus according to claim 1, further comprising:
a first transmission switch that provides a connection or a disconnect between the voltage generating end of the DA converter and an intermediate node;
a second transmission switch that provides a connection or a disconnect between the intermediate node and the output end;
a first capacitor section provided between the intermediate node and the standard potential; and
a second capacitor section provided between the output end and the standard potential, wherein
the control section connects the first transmission switch during at least a portion of a period of the output mode, and connects the second transmission switch for at least a portion of a period during which the first transmission switch is disconnected.

8. The signal generating apparatus according to claim 1, wherein
the signal generating apparatus switches between outputting, from the output end, a non-inverted voltage and an inverted voltage of the output voltage corresponding to the input data,
the signal generating apparatus comprises:
a first capacitor section;
a second capacitor section that is provided between the output end and the standard potential;
a first transmission switch that is controlled by the control section to provide a connection between a first terminal of the first capacitor section and one of the output end, the standard potential, and the voltage generating end of the DA converter; and
a second transmission switch that is controlled by the control section to provide a connection between a second terminal of the first capacitor section and one of the output end and the standard potential,
during at least a portion of an output mode, the control section connects the first terminal of the first capacitor section to the voltage generating end of the DA converter and connects the second terminal of the first capacitor section to the standard potential,
during a mode for outputting the non-inverted voltage, the control section connects the first terminal of the first capacitor section to the output end and connects the second terminal of the first capacitor section to the standard potential during a period other than said at least a portion of the output mode, and
during a mode for outputting the inverted voltage, the control section connects the first terminal of the first capacitor section to the standard potential and connects the second terminal of the first capacitor section to the output end during a period other than said at least a portion of the output mode.

9. The signal generating apparatus according to claim 8, wherein
the signal generating apparatus outputs, from a non-inversion output end and an inversion output end, a differential voltage corresponding to the input data,
the signal generating apparatus comprises:
a non-inversion first capacitor section, a non-inversion second capacitor section, a non-inversion first transmission switch, and a non-inversion second transmission switch, which correspond to the non-inversion output end; and
an inversion first capacitor section, an inversion second capacitor section, an inversion first transmission switch, and an inversion second transmission switch, which correspond to the inversion output end, and
the control section switches the non-inversion first transmission switch and the non-inversion second transmission switch during the mode for outputting the non-inverted voltage and switches the inversion first transmission switch and the inversion second transmission switch during the mode for outputting the inverted voltage.

10. The signal generating apparatus according to claim 8, wherein
the signal generating apparatus outputs, from a non-inversion output end and an inversion output end, a differential voltage corresponding to the input data,
the signal generating apparatus comprises:
a non-inversion second capacitor section provided between the non-inversion output end and the standard potential; and
an inversion second capacitor section provided between the inversion output end and the standard potential, during a period other than said at least a portion of the output mode, the control section switches between an operation for charging the non-inversion second capacitor section with the non-inverted voltage and an operation for charging the inversion second capacitor section with the inverted voltage, when charging the non-inversion second capacitor section with the non-inverted voltage, the control section connects the first terminal of the first capacitor section to the non-inversion output end and connects the second terminal of the first capacitor section to the standard potential, and when charging the inversion second capacitor section with the inverted voltage, the control section connects the first terminal of the first capacitor section to the standard potential and connects the second terminal of the first capacitor section to the inversion output end.

11. The signal generating apparatus according to claim 1, further comprising a charging section that charges the capacitor section, wherein before or during the charging of the capacitor section with the DA converter, the control section charges the capacitor section with the charging section.

12. The signal generating apparatus according to claim 11, wherein the control section changes a charge amount of the charging section according to a difference between input data supplied thereto and input data supplied thereto in an immediately prior sample.

13. The signal generating apparatus according to claim 1, wherein the DA converter outputs a voltage that is obtained by correcting the output voltage corresponding to the input data at an initial stage in a cycle of the refresh mode and the output mode repeating according to the supply of the input data.

14. The signal generating apparatus according to claim 13, wherein the DA converter changes the output voltage output at the initial stage in the cycle according to a difference between input data supplied thereto and input data supplied thereto in an immediately prior sample.

15. A signal generating apparatus that outputs from an output end thereof an output voltage corresponding to input data supplied thereto, comprising:

a DA converter that outputs a voltage corresponding to data supplied thereto;

a capacitor section that is provided between the output end and a standard potential;

a transmission switch that provides a connection or a disconnect between a voltage generating end of the DA converter and the output end; and a control section that causes the DA converter to charge the capacitor section with a voltage corresponding to the input data by repeatedly connecting and disconnecting the transmission switch, thereby causing the voltage of the capacitor section to gradually approach the output voltage corresponding to the input data, wherein the capacitor section can switch between having a first capacitance and having a second capacitance, which is greater than the first capacitance, the control section switches the capacitor section to the first capacitance during a high-speed mode and switches the capacitor section to the second capacitance during a low-speed mode.

16. A signal generating apparatus that outputs from an output end thereof an output voltage corresponding to input data supplied thereto, comprising:

a DA converter that outputs a voltage corresponding to data supplied thereto;

a capacitor section that is provided between the output end and a standard potential;

a transmission switch that provides a connection or a disconnect between a voltage generating end of the DA converter and the output end;

a control section that causes the DA converter to charge the capacitor section with a voltage corresponding to the input data by repeatedly connecting and disconnecting the transmission switch, thereby causing the voltage of the capacitor section to gradually approach the output voltage corresponding to the input data; and a comparing section that compares a voltage of a signal output from an analog circuit that propagates the output voltage output from the output end and a voltage output by the DA converter, wherein with the transmission switch disconnected, the control section causes the DA converter to output a comparison voltage corresponding to comparison data and causes the comparing section to compare the voltage of the signal output from the analog circuit to the comparison voltage, and the control section detects the voltage of the signal output from the analog circuit based on the comparison result and adjusts the output voltage of the DA converter based on the detected voltage.

17. The signal generating apparatus according to claim 1, further comprising a comparing section that compares a voltage of a signal output from an analog circuit that propagates the output voltage output from the output end and a voltage output by the DA converter, wherein the control section uses the DA converter to charge the capacitor section to a setting voltage corresponding to setting data, the control section supplies the analog circuit with the setting voltage from the capacitor section, and with the transmission switch disconnected, the control section causes the DA converter to output a comparison voltage corresponding to comparison data and causes the comparing section to compare a voltage of a signal output from the analog circuit to the comparison voltage, and measures a settling waveform of the voltage of the signal output from the analog circuit, which is the waveform from when the setting voltage is supplied to the analog circuit to when the waveform stabilizes, based on the comparison result of the comparing section.

18. A test apparatus that tests a device under test, comprising:

the signal generating apparatus according to claim 1 that sets a voltage to be supplied to the device under test; and a drive section that supplies the voltage set by the signal generating apparatus.

* * * * *